United States Patent
Houman et al.

(10) Patent No.: US 7,927,473 B2
(45) Date of Patent: Apr. 19, 2011

(54) SUBSTRATE HOLDER, DEPOSITION METHOD USING SUBSTRATE HOLDER, HARD DISK MANUFACTURING METHOD, DEPOSITION APPARATUS, AND PROGRAM

(75) Inventors: Shinya Houman, Tama (JP); Hiroshi Torii, Tachikawa (JP)

(73) Assignee: Canon Anelva Corporation, Kanagawa-ken (JP)

( * ) Notice: Subject to any disclaimer, the term of this patent is extended or adjusted under 35 U.S.C. 154(b) by 0 days.

(21) Appl. No.: 12/754,364

(22) Filed: Apr. 5, 2010

(65) Prior Publication Data
US 2010/0189912 A1    Jul. 29, 2010

Related U.S. Application Data

(63) Continuation of application No. PCT/JP2008/073477, filed on Dec. 24, 2008.

(30) Foreign Application Priority Data

Dec. 26, 2007  (JP) .................................. 2007-333836

(51) Int. Cl.
*C23C 14/34* (2006.01)
*C23C 16/00* (2006.01)

(52) U.S. Cl. ................... 204/298.15; 118/500; 118/503; 118/728; 118/729; 156/345.51; 156/345.54

(58) Field of Classification Search ............. 204/298.15; 118/500, 503, 728, 729; 156/345.51, 345.54
See application file for complete search history.

(56) References Cited

U.S. PATENT DOCUMENTS

| 6,228,429 B1 | 5/2001 | Bluck et al. |
| 2007/0015010 A1 | 1/2007 | Horigome et al. |

FOREIGN PATENT DOCUMENTS

| JP | 7-243037 A | 9/1995 |
| JP | 2926740 B2 | 7/1999 |
| JP | 3002632 B2 | 1/2000 |
| JP | 2000-222717 A | 8/2000 |
| JP | WO 01/56708 A1 | 8/2001 |
| JP | 2002-319125 A | 10/2002 |
| JP | 2003-521792 A | 7/2003 |
| JP | 2006-216216 A | 8/2006 |

OTHER PUBLICATIONS

International Search Report of PCT/JP2008/073477 dated Mar. 24, 2009.
Non-English Written Opinion of the International Searching Authority PCT/JP2008/073477 dated Mar. 24, 2009.

*Primary Examiner* — Rodney G McDonald
(74) *Attorney, Agent, or Firm* — Buchanan Ingersoll & Rooney PC

(57) ABSTRACT

A substrate holder for supporting an insulating substrate includes a conductive substrate holder main body having an opening, a first support member formed to protrude inside the opening from the inner periphery of the opening, and including a clamping member which supports one end portion of the insulating substrate, and a second support member including a clamping member which supports the other end portion of the insulating substrate, and is movable so as to protrude inside the opening or retract from inside the opening.

5 Claims, 23 Drawing Sheets

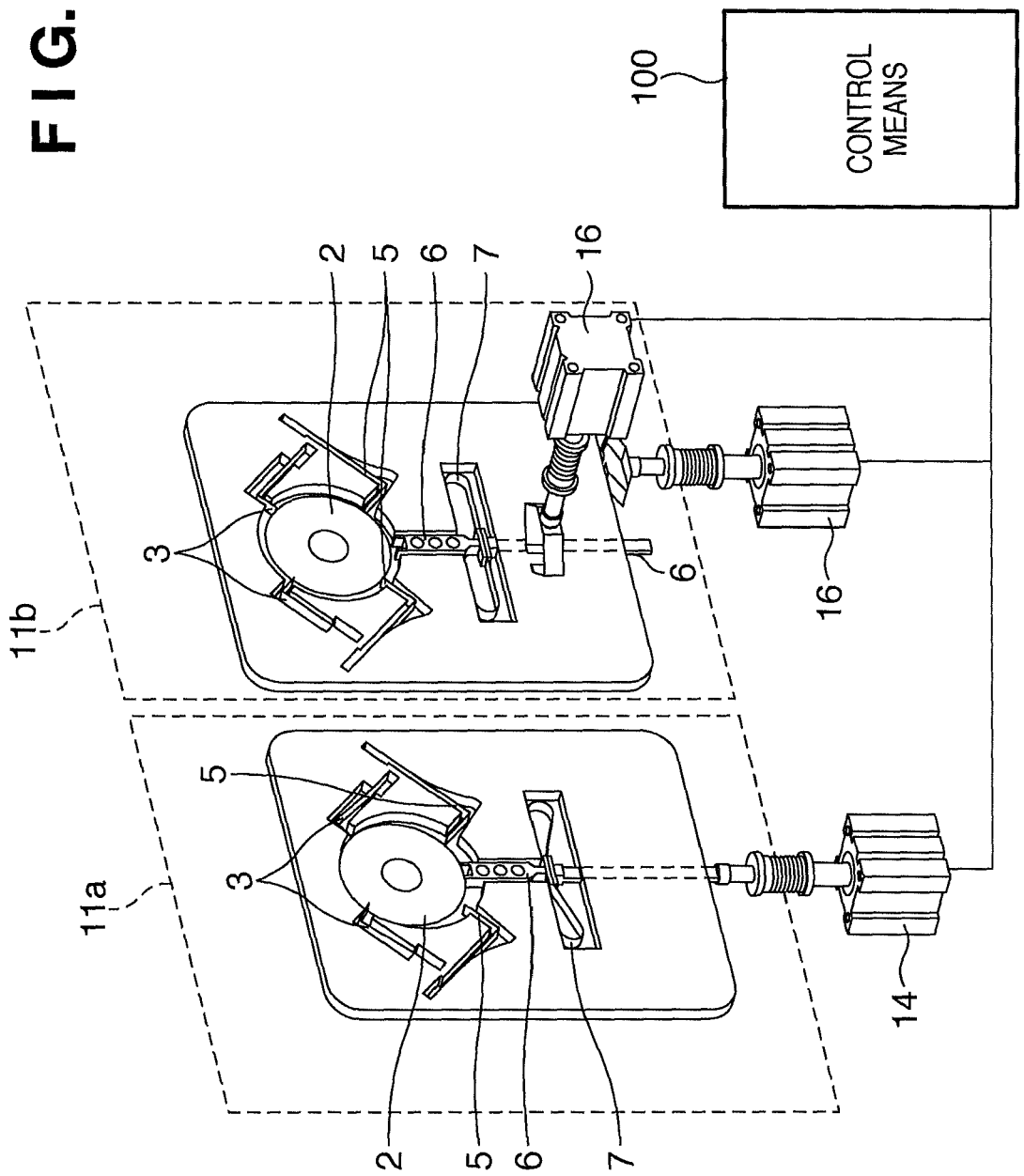

SUBSTRATE HOLDER, DEPOSITION METHOD USING SUBSTRATE HOLDER, HARD DISK MANUFACTURING METHOD, DEPOSITION APPARATUS, AND PROGRAM

TECHNICAL FIELD

The present invention relates to a substrate holder to be used when continuously depositing a plurality of thin films on the two principal surfaces of an insulating substrate in, for example, a hard disk manufacturing process, a deposition method using the substrate holder, a hard disk manufacturing method, a deposition apparatus, and the like.

BACKGROUND ART

In a hard disk manufacturing process, a plurality of thin films are continuously deposited on the two principal surfaces of an insulating substrate at the same time. More specifically, after an underlayer made of a metal film is deposited, a magnetic layer is deposited by applying a bias voltage to the underlayer. As a deposition apparatus to be used when the step of continuously depositing a plurality of thin films includes the bias voltage application deposition step, an apparatus including a substrate shift chamber and substrate shift mechanism is disclosed in patent reference 1. FIG. 5 is an exemplary view of the main parts of this apparatus.

In this apparatus, a substrate holder includes a main body 21 and a plurality of substrate supporting pawls 23a and 23b, and holds an insulating substrate 22 such that the two principal surfaces are parallel to the vertical direction. After an underlayer made of a metal film is deposited on the substrate 22, a substrate shift mechanism 31 holds the substrate 22 held by the substrate holder, and a release mechanism (not shown) pushes down the substrate supporting pawl 23b, thereby releasing the substrate 22 from the substrate supporting pawls 23a and 23b. After that, the substrate 22 is supported again as it is rotated so that the substrate supporting pawls 23a and 23b are positioned on the underlayer deposition surface, thereby electrically connecting the underlayer on the substrate 22 and the main body 21 of the substrate holder. This substrate holder is moved to a deposition chamber for performing the bias voltage application step, and an electrode mover (not shown) of a bias voltage application electrode is brought into contact with the main body 21 of the substrate holder. The next deposition is performed by applying a bias voltage to the underlayer via the main body 21 and substrate supporting pawls 23a and 23b.

In the apparatus described in patent reference 1, however, the substrate 22 is transferred from the substrate holder to the substrate shift mechanism 31 after once the underlayer is deposited, and supported by the substrate holder again after being rotated. Therefore, the substrate may fall when it is transferred or supported again as described above. Also, the substrate shift mechanism 31 has a complicated structure, so a specialized vacuum chamber including the mechanism is necessary. This increases the size of the whole apparatus.

As apparatuses having solved this problem, patent references 2 to 4 have disclosed apparatuses in which a bias voltage application pawl is prepared in addition to substrate supporting pawls of a substrate holder, and deposition is performed by bringing the bias voltage application pawl into contact with a substrate in only the bias voltage application deposition step. FIGS. 6A, 6B, 7A, and 7B are exemplary views of substrate holders of these apparatuses.

A substrate holder shown in FIGS. 6A and 6B includes a main body 41, a plurality of substrate supporting pawls 43, and a specialized bias voltage application pawl 44. This apparatus has a structure in which all the substrate supporting pawls 43 are in contact with a substrate 42, and a mechanism (not shown) pushes down the specialized bias voltage application pawl 44 when depositing an underlayer (FIG. 6A). After that, the specialized bias voltage application pawl 44 is brought into contact with the underlayer by releasing the mechanism having pushed down the specialized bias voltage application pawl 44, and deposition is performed by applying a bias voltage from a bias voltage source 45 to the underlayer via the specialized bias voltage application pawl 44 (FIG. 6B).

Also, a substrate holder shown in FIGS. 7A and 7B includes a main body 51, a plurality of substrate supporting pawls 53, and a specialized bias voltage application pawl 54. In this apparatus, a substrate 52 is normally supported by the substrate supporting pawls 53 alone, and the specialized bias voltage application pawl 54 is separated from the substrate (FIG. 7A). An underlayer is deposited in this state. In the bias voltage application deposition step after that, a bias voltage supply bar 56 pushes down the specialized bias voltage application pawl 54 and brings it into contact with the underlayer (FIG. 7B). In this state, deposition is performed by applying a bias voltage from a bias voltage source 55 to the underlayer via the bias voltage supply bar 56 and specialized bias voltage application pawl 54.

Patent reference 1: Japanese Patent Laid-Open No. 7-243037
Patent reference 1: Japanese Patent Laid-Open No. 2003-521792
Patent reference 3: Japanese Patent No. 3002632
Patent reference 4: Japanese Patent No. 2926740

DISCLOSURE OF INVENTION

Problems that the Invention is to Solve

The apparatuses disclosed in patent references 2 to 4 have simple structures because the specialized bias voltage application pawl is brought into contact with a substrate in only the bias voltage application step.

In the bias voltage application deposition step, however, the specialized bias voltage application pawl is used in addition to the substrate supporting pawls supporting the substrate. This increases the number of areas (shadow areas) where no film is deposited because the substrate is covered with the pawls.

It is an object of the present invention to provide a substrate holder which is used in a step of continuously depositing a plurality of thin films, including a bias voltage application deposition step and non-bias voltage application deposition step, does not increase the size of a deposition apparatus because the structure is simple, and reduces the number of shadow areas formed during deposition. It is another object of the present invention to provide a deposition apparatus and deposition method using the substrate holder.

Means of Solving the Problems

A substrate holder according to the present invention which achieves the above objects is a substrate holder for supporting an insulating substrate, comprising
 a conductive substrate holder main body having an opening,
 a first support member formed to protrude inside the opening from an inner periphery of the opening, and including a clamping member which supports one end portion of the insulating substrate, and a second support member including a clamping member which supports the other end portion of the insulating substrate, and configured to move to protrude inside the opening or retract from inside the opening, wherein at least one of the first support members is a bias voltage application support member configured to apply a bias voltage to the insulating substrate, and when supporting the insulating substrate using the clamping member of the second support member, the second support member protrudes inside the opening such that the clamping member of the bias voltage application support member separates from the insulating substrate, and when supporting the insulating substrate using the clamping member of the bias voltage application support member, the second support member retracts from a position where the other end portion of the insulating substrate is supported by the clamping member of the second support member to a position where the insulating substrate is supported by the clamping member of the bias voltage application support member.

A deposition apparatus according to the present invention which achieves the above objects is a deposition apparatus which continuously deposits a plurality of thin films on two surfaces of an insulating substrate at the same time, comprising:

a first deposition chamber which deposits a conductive film on the insulating substrate without applying any voltage to the insulating substrate, a second deposition chamber which deposits a thin film on the insulating substrate by applying a voltage to the insulating substrate, a substrate holder including a conductive substrate holder main body having an opening, a first support member formed to protrude inside the opening from an inner periphery of the opening, including a clamping member which supports one end portion of the insulating substrate, and including a bias voltage application support member configured to apply a bias voltage to the insulating substrate, and a second support member including a clamping member which supports the other end portion of the insulating substrate, and configured to move to protrude inside the opening or retract from inside the opening, driving means which is installed in the first deposition chamber, and moves the second support member while supporting the substrate using the clamping member of the second support member such that the clamping member of the first support member separates from the substrate, or moves the second support member from a position where the other end portion of the insulating substrate is supported by the clamping member of the second support member to a position where the insulating substrate is supported by the clamping member of the first support member, voltage application means which is installed in the second deposition chamber and applies a voltage to the first support member, and control means for controlling the movement by the driving means, the voltage application by the voltage application means, the operation of the first deposition chamber, and the operation of the second deposition chamber, wherein the first deposition chamber controlled by the control means deposits a conductive film on the substrate in a position where the clamping member of the first support member is spaced apart from the substrate, the control means controls the driving means to move down the second support member to a position where the substrate on which the conductive film is deposited is supported by the clamping member of the first support member, and the control means controls the voltage application means to apply the voltage to the first support member, and controls the operation of the second deposition chamber while applying the voltage, thereby depositing a thin film on the insulating substrate on which the conductive film is deposited.

A deposition method according to the present invention which achieves the above objects is a deposition method in which, in a method of sequentially depositing a plurality of thin films on a surface of an insulating substrate by supporting the insulating substrate by a substrate support member in a vacuum processing chamber, at least one of the plurality of thin films is deposited by bias sputtering, comprising steps of:

loading the insulating substrate on a substrate holder including a conductive substrate holder main body having an opening, a first support member deposited to protrude inside the opening from an inner periphery of the opening, including a clamping member which supports one end portion of the insulating substrate, and including a bias voltage application support member configured to apply a bias voltage to the insulating substrate, and a second support member including a clamping member which supports the other end portion of the insulating substrate, and configured to move to protrude inside the opening or retract from inside the opening, transferring the substrate holder into a first deposition chamber, depositing an underlayer as a conductive film on the insulating substrate while supporting the insulating substrate using the second support member and the first support member except for the bias voltage application support member, transferring the substrate holder into a second deposition chamber, and depositing a thin film on the insulating substrate while supporting the insulating substrate using the first support member, and applying the bias voltage to the insulating substrate from the bias voltage application support member.

A program according to the present invention which achieves the above objects is a program which causes a computer to execute a deposition method in which, in a method of sequentially depositing a plurality of thin films on a surface of an insulating substrate by supporting the insulating substrate using a substrate support member in a vacuum processing chamber, at least one of the plurality of thin films is deposited by bias sputtering, the deposition method comprises steps of loading the insulating substrate on a substrate holder including a conductive substrate holder main body having an opening, a first support member formed to protrude inside the opening from an inner periphery of the opening, including a clamping member which supports one end portion of the insulating substrate, and including a bias voltage application support member configured to apply a bias voltage to the insulating substrate, and a second support member including a clamping member which supports the other end portion of the insulating substrate, and configured to move to protrude inside the opening or retract from inside the opening, transferring the substrate holder into a first deposition chamber, depositing an underlayer as a conductive film on the insulating substrate while supporting the insulating substrate using the second support member and the first support member except for the bias voltage application support member, transferring the substrate holder into a second deposition chamber, and depositing a thin film on the insulating substrate while supporting the insulating substrate using the first support member, and applying the bias voltage to the insulating substrate from the bias voltage application support member.

Effects of the Invention

The present invention can provide a substrate holder which is used in a step of continuously depositing a plurality of thin films, including a bias voltage application deposition step and non-bias voltage application deposition step, does not increase the size of a deposition apparatus because the structure is simple, and reduces the number of shadow areas formed during deposition, and can also provide a deposition apparatus and deposition method using the substrate holder.

In the present invention, the size of the apparatus does not increase because the structure is simple, the generation of particles is suppressed because the number of times that separation of the pawls from a substrate is performed is small as a whole, and the number of shadow areas is reduced compared to the conventional apparatuses.

In addition, the substrate supporting pawls always supporting a substrate are electrically insulated from the main body. This makes it possible to reduce the generation of abnormal discharge in the substrate support portion during bias voltage application deposition.

Accordingly, the present invention can efficiently perform deposition at a high yield by reducing shadow areas compared to the conventional apparatuses, and can inexpensively provide a high-quality member such as a hard disk obtained by continuously depositing a plurality of thin layers.

BRIEF DESCRIPTION OF DRAWINGS

The accompanying drawings, which are incorporated in and constitute a part of the specification, illustrate embodiments of the invention and, together with the description, serve to explain the principles of the invention.

FIG. 9 is a perspective view showing a modification of FIG. 3;

BEST MODE FOR CARRYING OUT THE INVENTION

Embodiments of the present invention will be explained in detail below. However, constituent elements described in these embodiments are merely examples, and the technical scope of the present invention is determined by the scope of the appended claims and is not limited by the following individual embodiments.

Figure 1:
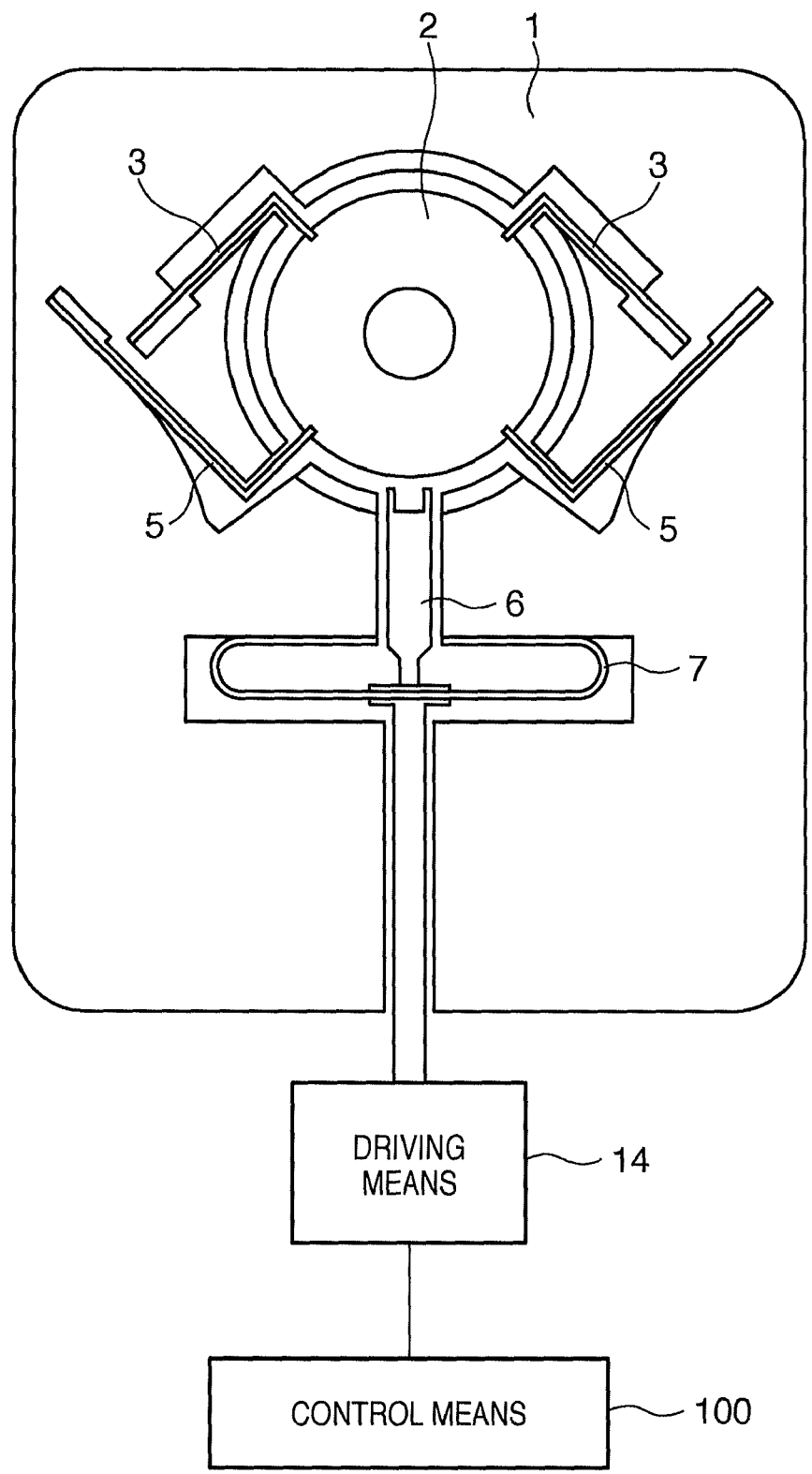
FIG. 1 is a view showing the state in which a substrate is held by an embodiment of a first substrate holder of the present invention, and used in bias voltage application deposition.
Figure 2:
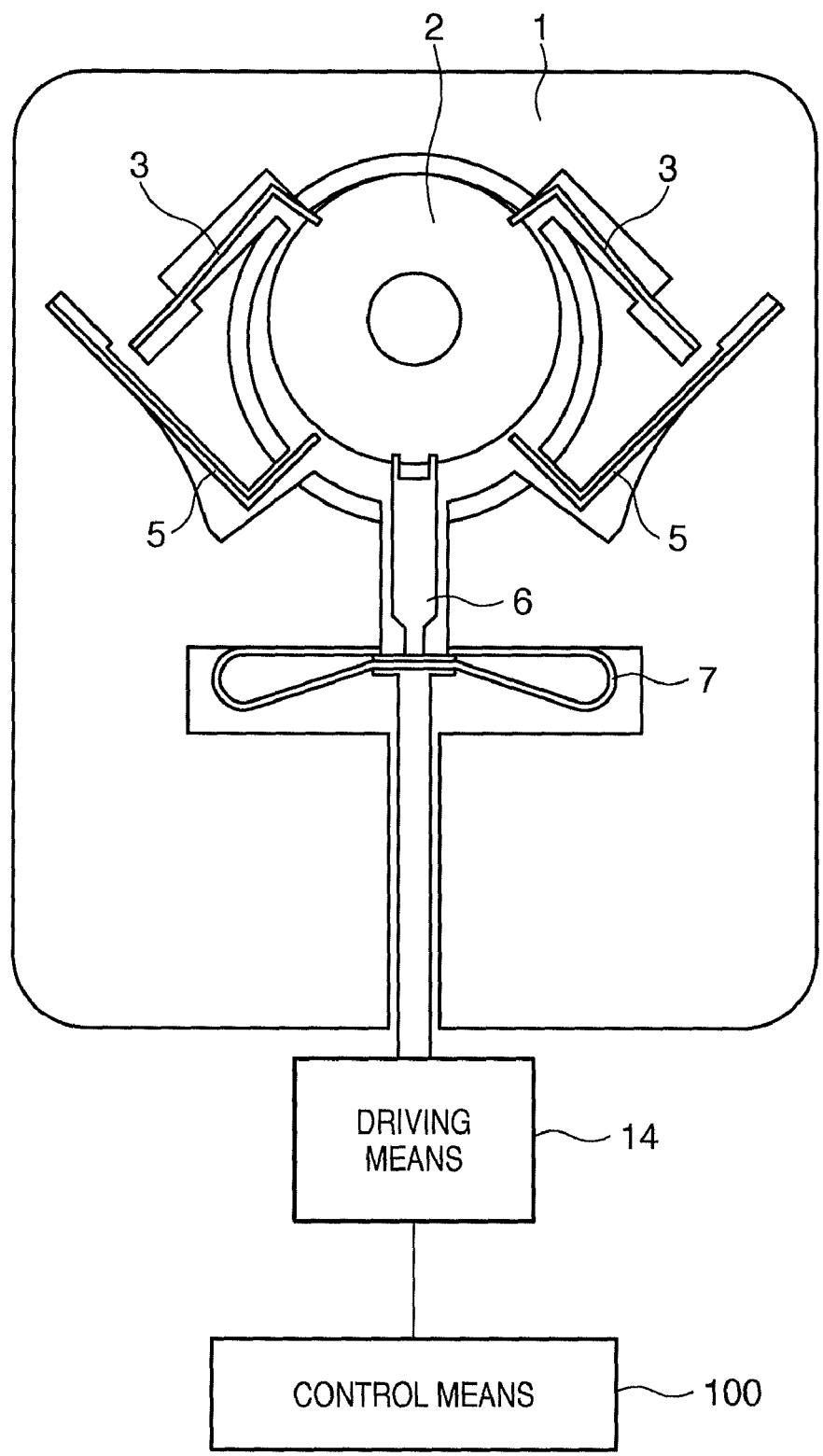
FIG. 2 is a view showing the state in which a substrate is held by the embodiment of the first substrate holder of the present invention, and used in non-bias voltage application deposition.

FIGS. 1 and 2 are views showing the state in which a substrate is held by a preferred embodiment of a first substrate holder of the present invention. FIG. 1 shows the state when performing bias voltage application deposition, and FIG. 2 shows the state when performing non-bias voltage application deposition. In FIGS. 1 and 2, reference numeral 1 denotes a main body of the substrate holder; 2, an insulating substrate; 3 and 5, substrate supporting pawls; 6, an auxiliary substrate supporting pawl; and 7, an elastic member such as a leaf spring.

The substrate holder of the present invention has the plurality of substrate supporting pawls 3 and 5 for supporting the insulating substrate 2 and the conductive substrate holder main body (to be referred to as the "main body 1" hereinafter), and also includes the auxiliary substrate supporting pawl 6. The main body 1 is a flat plate and has an opening larger than the outer shape of the insulating substrate 2 in the middle portion. In this opening, the substrate supporting pawls 3 and 5 protrude inside the opening from the main body 1, that is, from the inner periphery of the opening. As will be described later, an external bias voltage application means can come in and get out of contact with the main body 1, so a bias voltage can externally be applied to the main body 1. The substrate supporting pawls 3 and 5 are formed to protrude inside the opening formed in the main body 1 of the substrate holder from the inner periphery of the opening, and function as first support members each having a clamping member that supports one end portion of the periphery of the insulating substrate (the outer periphery of the substrate). At least one of the first support members functions as a bias voltage application support member for applying the bias voltage to the substrate.

All the plurality of substrate supporting pawls 3 and 5 are made of a conductive material and electrically connected to the main body 1.

In the present invention, in the opening of the vertically installed main body 1, the substrate supporting pawls hold the substrate 2 with a predetermined distance from the main body 1. That is, the substrate supporting pawls 3 and 5 come in contact with the outer shape end face of the substrate 2, and vertically hold the substrate 2 in the opening of the main body 1. Note that the auxiliary substrate supporting pawl 6 is set vertically movable such that its distal end is positioned below the substrate 2. The auxiliary substrate supporting pawl 6 has a lower end connected to a driving means 14, and can be moved up (to protrude inside the opening) or moved down (to retract from inside the opening) by the operation of the driving means 14. A control means 100 is connected to the driving means 14, and can control a vertical motion of moving up (protruding) or moving down (retracting) the driving means 14 in accordance with the bias voltage application deposition process or non-bias voltage application deposition process.

In this embodiment, the substrate supporting pawls 3 and 5 are respectively arranged in two portions in the upper half and two portions in the lower half of the substrate 2. When the auxiliary substrate supporting pawl 6 is out of contact with the substrate (FIG. 1), the substrate 2 is supported by all the substrate supporting pawls 3 and 5. The auxiliary substrate supporting pawl 6 is pushed up and brought into contact with the substrate 2 by the upward motion of the driving means 14. When the driving means 14 keeps pushing up the auxiliary substrate supporting pawl 6, the substrate 2 is pushed up by the spacing between the substrate 2 and main body 1 as shown in FIG. 2, and the substrate supporting pawls 5 having supported the substrate 2 from below separate from it and get out of contact with it. Note that since the substrate supporting pawls 3 are also pushed up by the substrate 2, the substrate supporting pawls 3 are preferably made of a flexible material that can withstand this upward motion. The auxiliary substrate supporting pawl 6 has a clamping member for supporting the other end portion of the insulating substrate, and functions as a second support member capable of moving so as to protrude inside the opening formed in the main body 1 of the substrate holder, or retract from the opening. When supporting the substrate 2 by the clamping member of the auxiliary substrate supporting pawl 6 (second support member), the clamping members of the bias voltage application support members (e.g., the substrate supporting pawls 5) separate from the substrate. When supporting the substrate by the clamping members of the bias voltage application support members (e.g., the substrate supporting pawls 5), the clamping member of the auxiliary substrate supporting pawl 6 (second support member) separates from the substrate, and the substrate moves from the position where the substrate is supported by the clamping member of the auxiliary substrate supporting pawl 6 (second support member) to the position where the substrate is supported by the clamping members of the bias voltage application support members (substrate supporting pawls 5).

To be able to well hold the substrate 2, the clamping member of each of the substrate supporting pawls 3 and 5 and auxiliary substrate supporting pawl 6 preferably has, for example, a V- or U-shaped recess in the section in the normal direction of the principal surface of the substrate 2, and clamps the end face of the substrate 2 in this recess.

In this embodiment, the elastic member 7 such as a leaf spring is attached below the auxiliary substrate supporting pawl 6. The elastic member 7 is pressed when pushing up the auxiliary substrate supporting pawl 6 by the upward motion of the driving means 14. Accordingly, by releasing the force pushing up the auxiliary substrate supporting pawl 6 by the downward motion of the driving means 14, the auxiliary substrate supporting pawl 6 automatically goes down and separates from the substrate 2 by the restoring force of the elastic member 7. At the same time the substrate 2 returns to the lower position, the substrate supporting pawls 5 come in contact with the substrate 2 again and support the substrate 2 having returned to the lower position.

In the present invention as shown in FIGS. 1 and 2, the substrate supporting pawls 5 can be brought out of and into contact with the substrate 2 by vertically moving the auxiliary substrate supporting pawl 6 so that it comes in and gets out of contact with the substrate 2. Accordingly, the substrate 2 takes the two states, that is, the state in which the substrate 2 is supported by the substrate supporting pawls 3 and auxiliary substrate supporting pawl 6, and the state in which the substrate 2 is supported by the substrate supporting pawls 3 and 5.

Note that in the present invention, the number of the substrate supporting pawls is preferably small as long as the substrate 2 can stably be held, because the number of shadow areas formed by the pawls is reduced. Although the two substrate supporting pawls are arranged in each of the upper and lower portions in FIGS. 1 and 2, it is also possible to form one substrate supporting pawl 3 vertically above the substrate 2. Furthermore, only one of the substrate supporting pawls 5 may also be formed.

Figure 3:
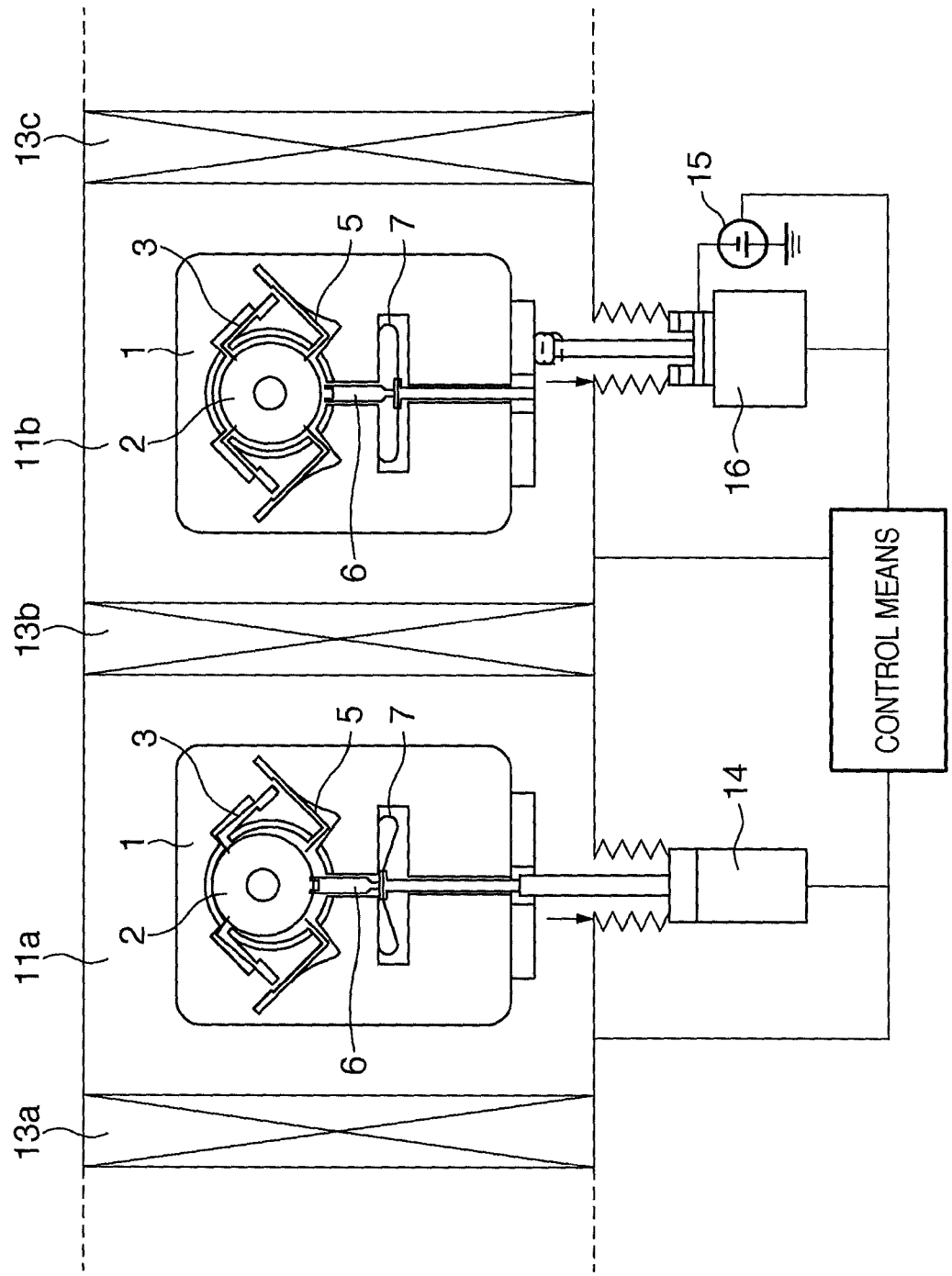
FIG. 3 is a view exemplarily showing a part of an embodiment of a deposition apparatus of the present invention.

FIG. 3 exemplarily shows an embodiment of a deposition apparatus of the present invention using the substrate holder shown in FIGS. 1 and 2.

The deposition apparatus of the present invention includes a plurality of deposition chambers, and a transfer means for transferring the insulating substrate 2 vertically held by the substrate holder between the plurality of deposition chambers. FIG. 3 shows a part of the deposition apparatus. In FIG. 3, reference numerals 11*a* and 11*b* denote deposition chambers. The deposition chamber 11*a* is used in non-bias voltage application deposition. The deposition chamber 11*b* is used in bias voltage application deposition. Reference numerals 13*a* to 13*c* denote gate valves.

The deposition chambers 11*a* and 11*b* of this apparatus each have sputtering cathodes for the two principal surfaces of the substrate 2, and each can simultaneously deposit films on the two surfaces of the substrate 2. Also, the substrate holder transfer means (not shown) can transfer the substrate holder in the horizontal direction of the drawing surface. Note that the deposition chambers 11*a* and 11*b* are horizontally arranged in a line in this embodiment, but the deposition apparatus of the present invention is not limited to a line type deposition apparatus. For example, the deposition apparatus may also have a form in which a plurality of deposition chambers surround a chamber positioned in the center.

In this apparatus, the deposition chamber 11*a* for performing non-bias voltage application deposition, which is positioned before the deposition chamber 11*b* for performing bias voltage application deposition, includes the driving means 14 for moving up the auxiliary substrate supporting pawl 6 by pushing it up, or moving down the auxiliary substrate supporting pawl 6. The control means 100 controls the operation of the driving means 14. Under the control of the control means 100, the driving means 14 can push up the auxiliary substrate supporting pawl 6 and bring it into contact with the substrate 2 so that the auxiliary substrate supporting pawl 6 supports the substrate 2, and separates the substrate supporting pawls 5 from the substrate 2 at the same time. In the deposition chamber 11*a* shown in FIG. 3, the auxiliary substrate supporting pawl 6 is pushed up by the driving means 14. When the state in which the driving means 14 has gone up is released (when the driving means 14 goes down in the direction of the arrow) under the control of the control means 100, the auxiliary substrate supporting pawl 6 also goes down and separates from the substrate 2. Note that FIG. 3 shows only one deposition chamber that is positioned below the chamber 11*b* for performing bias voltage application deposition, includes the driving means 14, and performs non-bias voltage application deposition, but the present invention is not limited to this. When performing non-bias voltage application deposition a plurality of number of times before bias voltage application deposition, a plurality of deposition chambers each of which includes the driving means 14 and performs non-bias voltage application deposition are arranged before the chamber 11*b* for performing bias voltage application deposition.

Figure 11A:
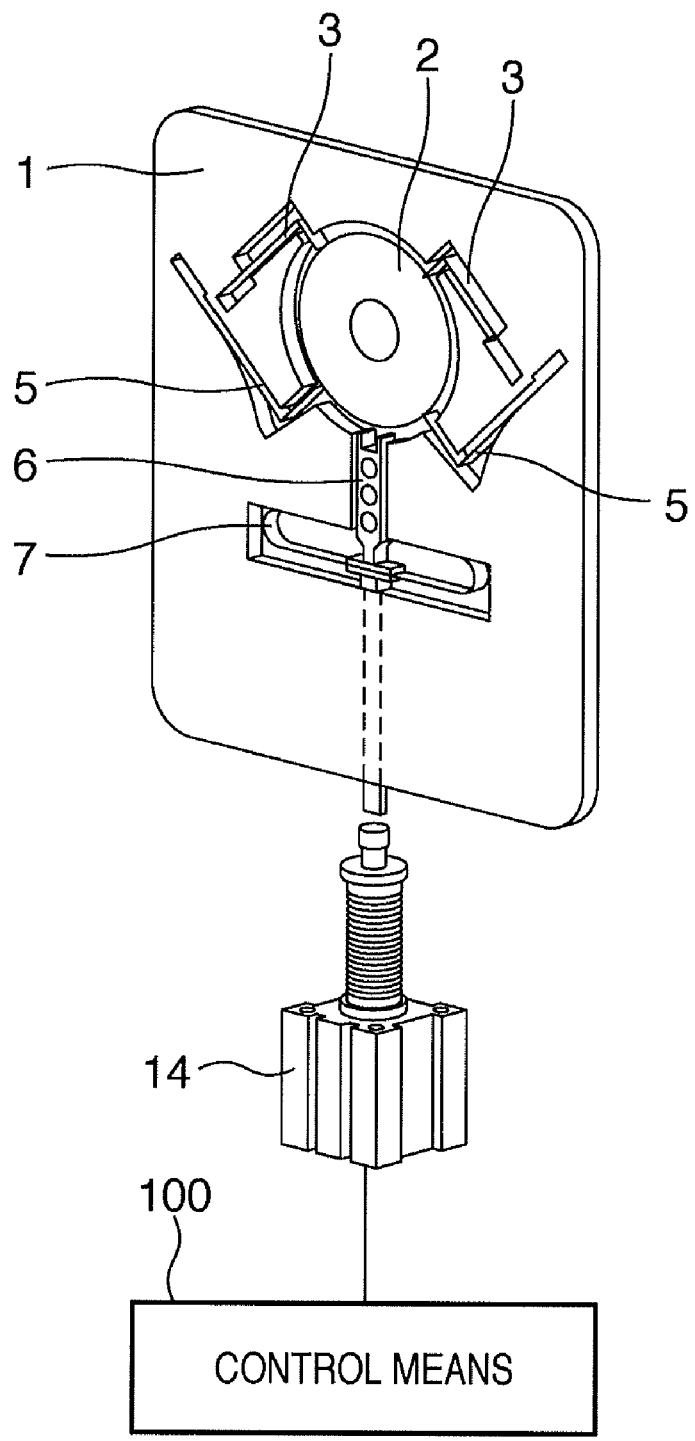
FIG. 11A is a view showing the state in which the control means 100 has moved down a driving means 14 to bring an auxiliary substrate supporting pawl 6 out of contact with a substrate 2, and the substrate 2 is supported by substrate supporting pawls 5 and substrate supporting pawls 3.
Figure 11B:
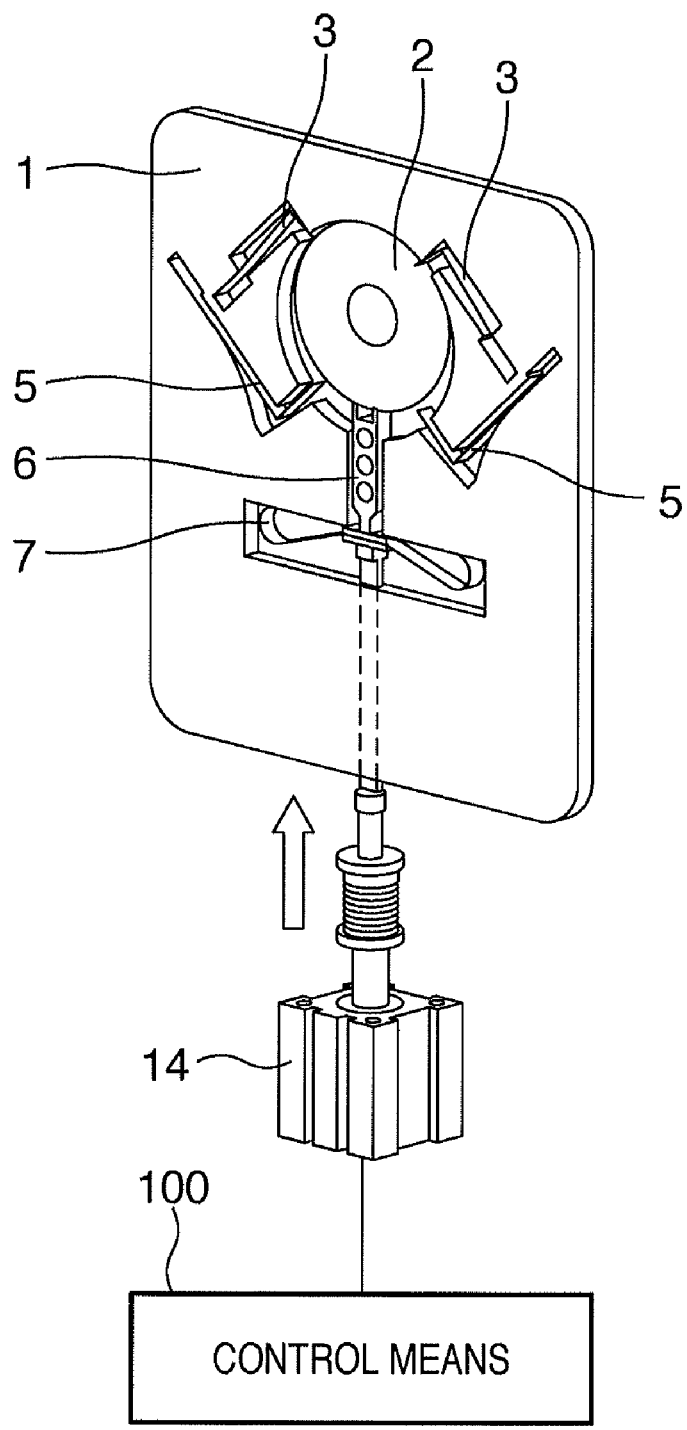
FIG. 11B is a view showing the state in which the control means 100 has moved up the driving means 14 to bring the auxiliary substrate supporting pawl 6 into contact with the substrate 2 and bring the substrate supporting pawls 5 out of contact with the substrate, and the substrate 2 is supported by the auxiliary substrate supporting pawl 6 and substrate supporting pawls 3.
Figure 12A:
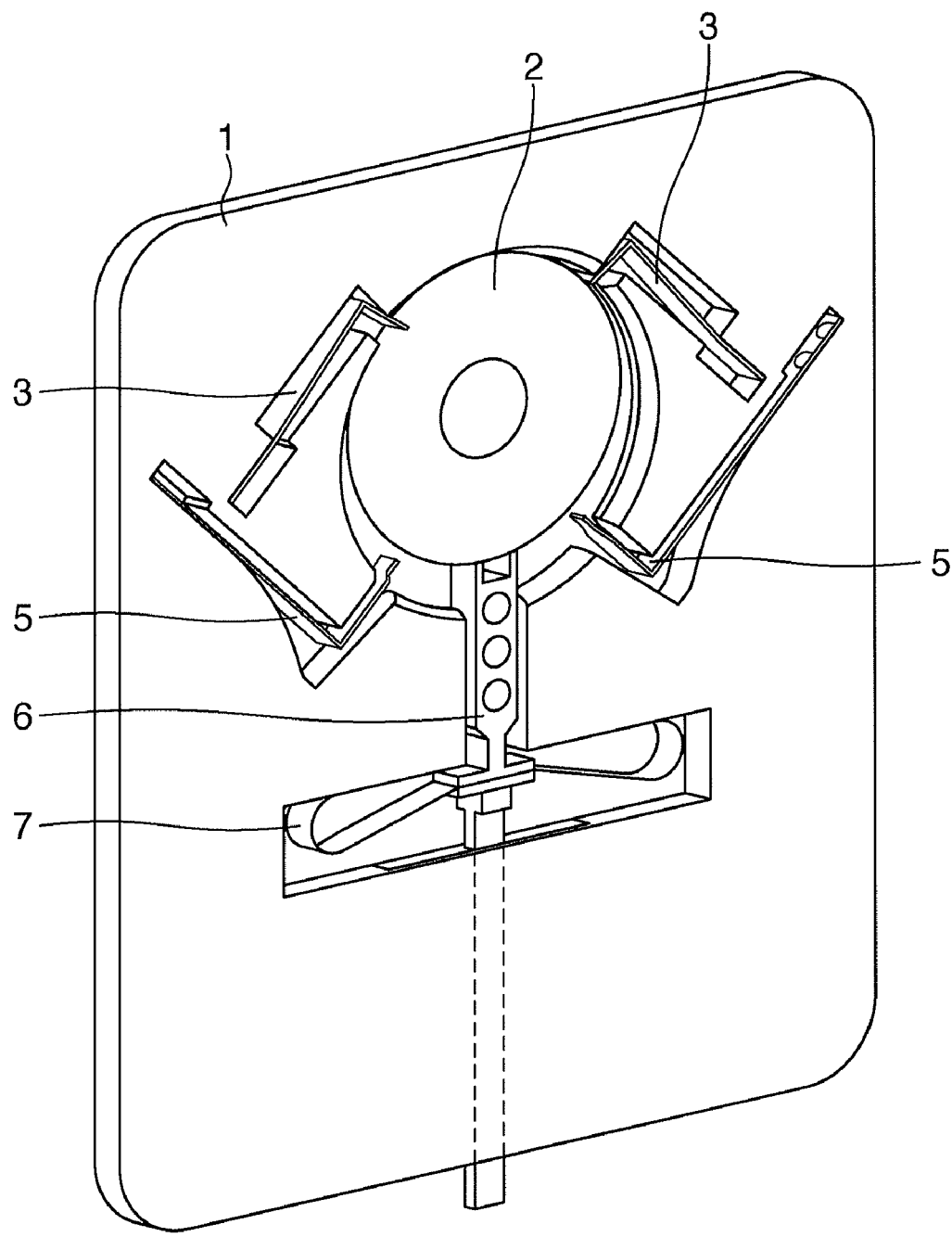
FIG. 12A is a view showing the state shown in FIG. 11B, in which the driving means 14 has gone up and come in contact with the auxiliary substrate supporting craw 6, and accordingly the auxiliary substrate supporting craw 6 has gone up and come in contact with the substrate 2.
Figure 12B:
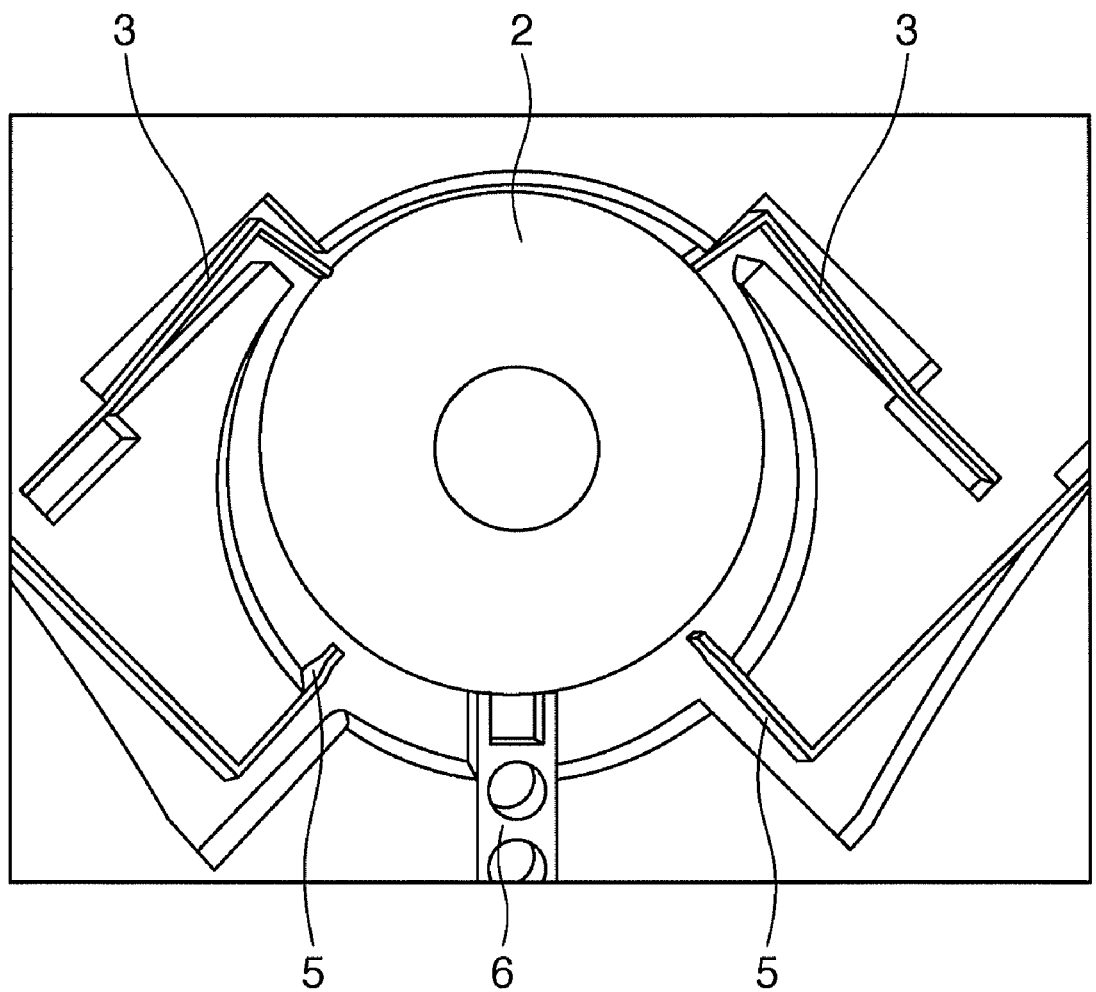
FIG. 12B is a view showing, in an enlarged scale, the state in which the auxiliary substrate supporting pawl 6 is in contact with the substrate, and the substrate supporting pawls 5 is out of contact with the substrate 2.
Figure 13A:
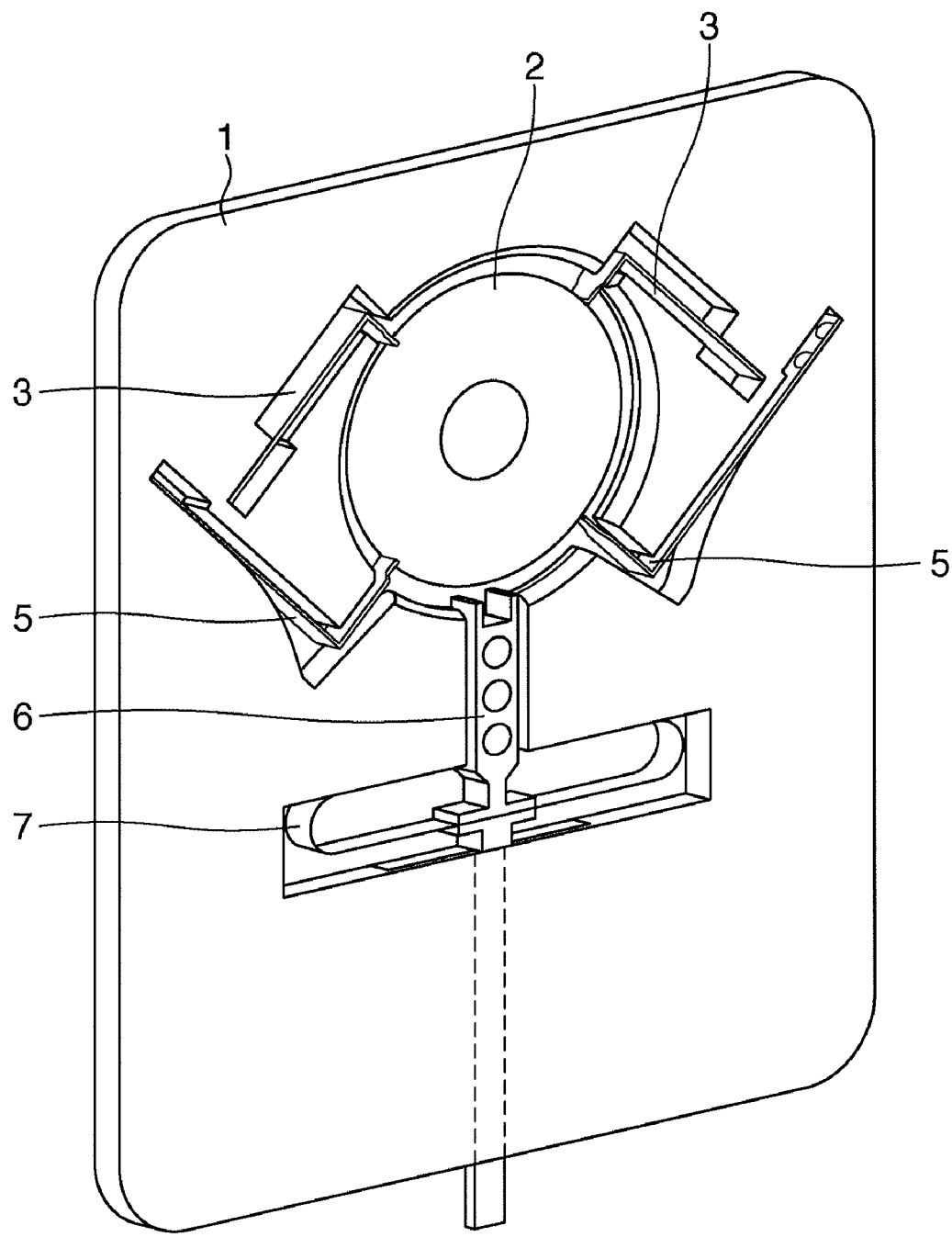
FIG. 13A is a view showing the state shown in FIG. 11A, in which the driving means 14 has gone down to bring the auxiliary substrate supporting pawl 6 out of contact with the substrate 2 and bring the substrate supporting pawls 5 into contact with the substrate 2, and the substrate 2 is supported by the substrate supporting pawls 3 and substrate supporting pawls 5.
Figure 13B:
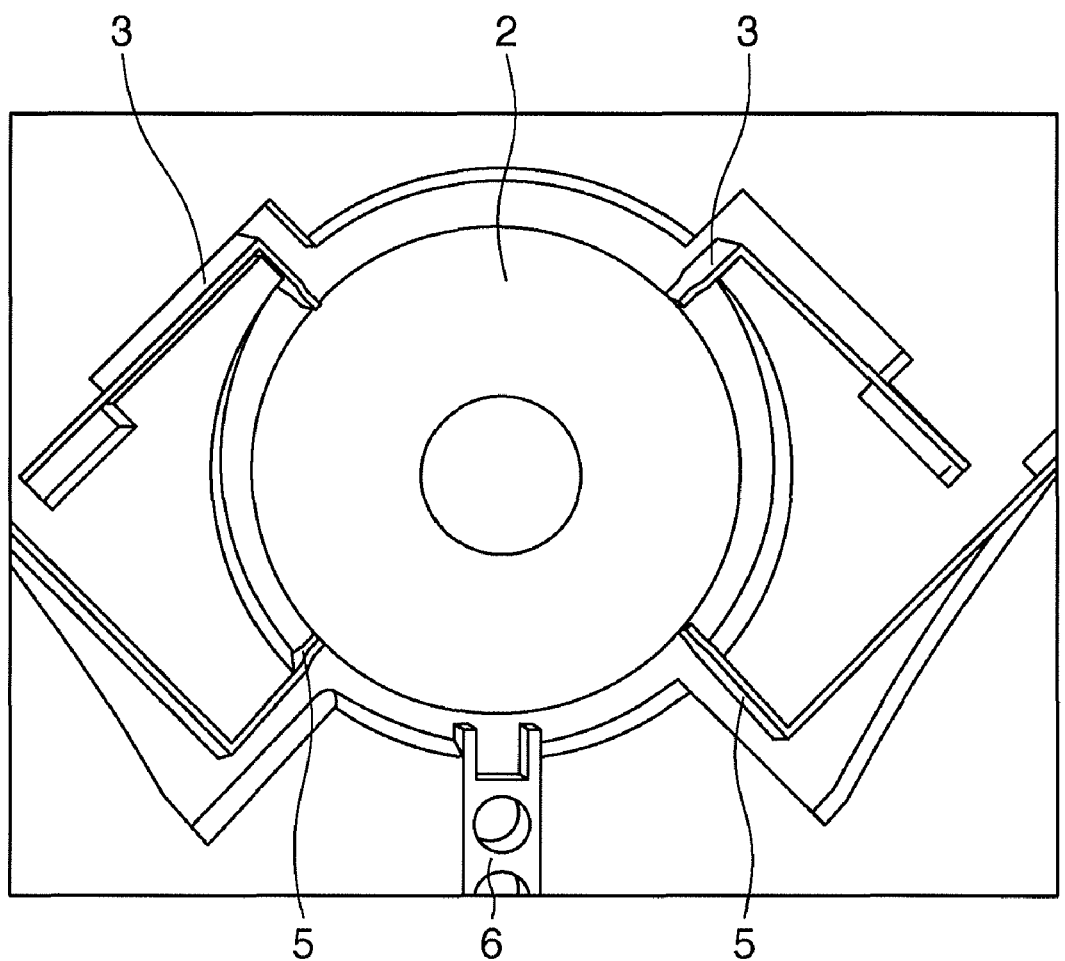
FIG. 13B is a view showing, in an enlarged scale, the states of the substrate supporting pawls 3 and substrate supporting pawls 5 in FIG. 13A.

FIGS. 11A and 11B to 13A and 13B are perspective views of the main body 1 of the substrate holder. In FIG. 11A, the control means 100 has moved down the driving means 14 to bring the auxiliary substrate supporting pawl 6 out of contact with the substrate 2, so the substrate 2 is supported by the substrate supporting pawls 5 and substrate supporting pawls 3. In FIG. 11B, the control means 100 has moved up the driving means 14 to bring the auxiliary substrate supporting pawl 6 into contact with the substrate 2 and bring the substrate supporting pawls 5 out of contact with the substrate, so the substrate 2 is supported by the auxiliary substrate supporting pawl 6 and substrate supporting pawls 3. FIG. 12A is a view showing the state shown in FIG. 11B, in which the driving means 14 has gone up and come in contact with the auxiliary substrate supporting pawl 6, and accordingly the auxiliary substrate supporting pawl 6 has gone up and come in contact with the substrate 2. FIG. 12B is a view showing, in an enlarged scale, the state in which the auxiliary substrate supporting pawl 6 is in contact with the substrate, and the substrate supporting pawls 5 are out of contact with the substrate 2. FIG. 13A is a view showing the state shown in FIG. 11A, in which the driving means 14 has gone down to bring the auxiliary substrate supporting pawl 6 out of contact with the substrate 2 and bring the substrate supporting pawls 5 into contact with the substrate 2, so the substrate 2 is supported by the substrate supporting pawls 3 and substrate supporting pawls 5. FIG. 13B is a view showing, in an enlarged scale, the states of the substrate supporting pawls 3 and substrate supporting pawls 5 shown in FIG. 13A.

Also, the deposition chamber 11*b* for performing bias voltage application deposition includes, for example, a bias voltage application means 16 for applying a bias voltage to the main body 1 from below, and a power supply 15 for supplying a voltage to the bias voltage application means 16. The bias voltage application means 16 has an electrode capable of going up or down ("the electrode of the bias voltage application means 16" will also simply be referred to as "the bias voltage application means 16" hereinafter). When the electrode of the bias voltage application means 16 goes up and comes in contact with the main body 1, the bias voltage application means 16 applies the bias voltage to at least one of the substrate supporting pawls 3 and 5 via the main body 1 of the substrate holder. The control means 100 is connected to the power supply 15 and bias voltage application means 16, and can control ON/OFF of the power supply 15 and the upward or downward motion of the electrode of the bias voltage application means 16.

In the deposition chamber 11*b* shown in FIG. 3, the electrode of the bias voltage application means 16 is moved up and brought into contact with the main body 1. When the electrode of the bias voltage application means 16 is moved down in the direction of the arrow from this state under the control of the control means 100, the electrode of the bias voltage application means 16 gets out of contact with the main body 1, so no bias voltage can be applied to the main body 1 any longer.

Figure 14A:
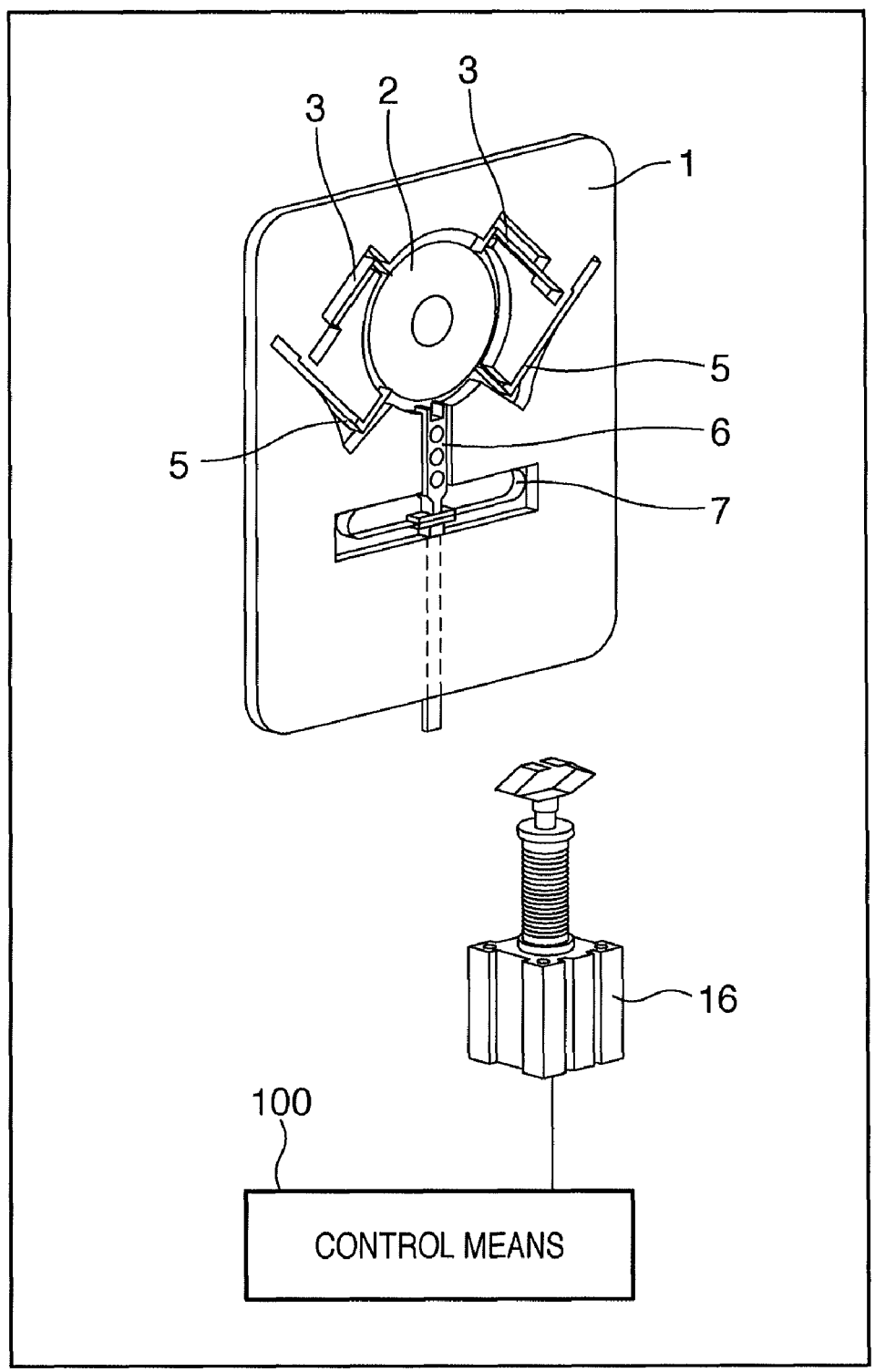
FIG. 14A is a view showing the state in which the electrode of the bias voltage application means 16 has gone down and gotten out of contact with a main body 1, and no bias voltage is applied to the substrate 2.
Figure 14B:
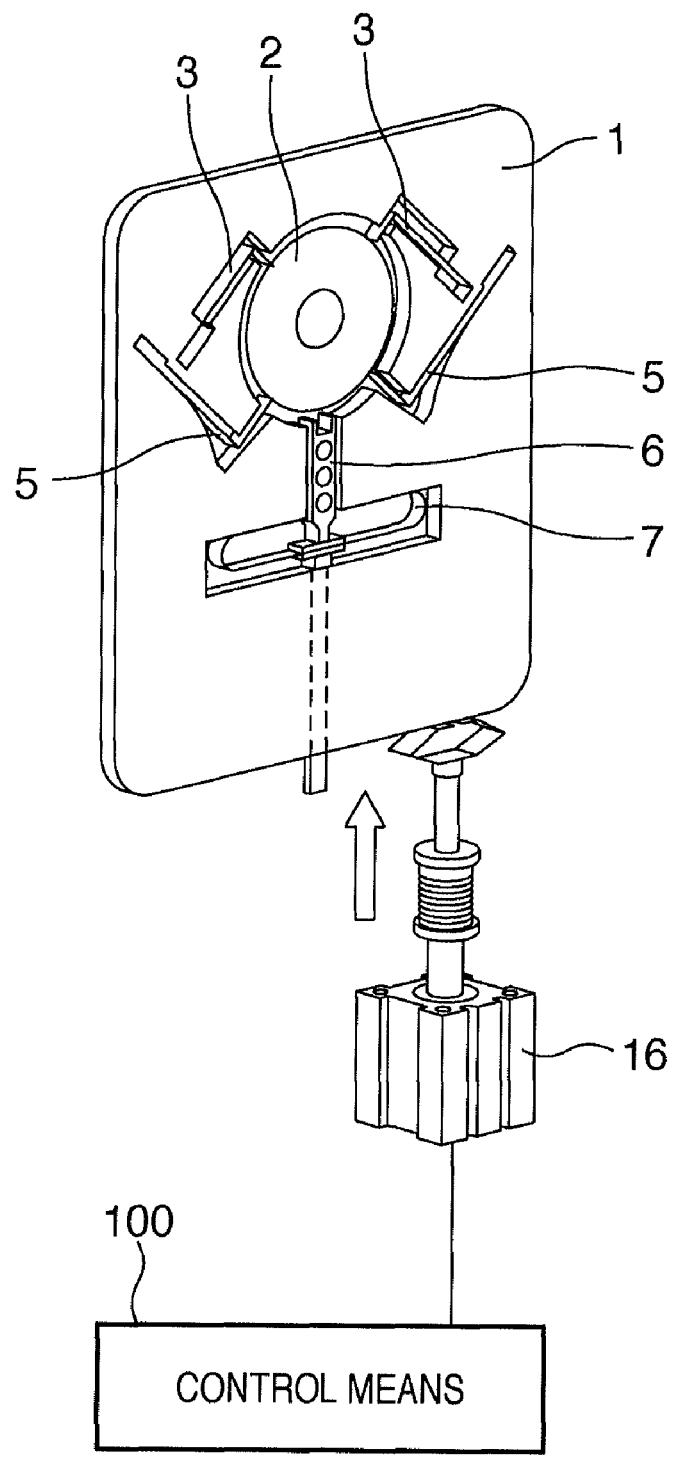
FIG. 14B is a view showing the state in which the electrode of the bias voltage application means 16 controlled by the control means 100 has gone up and come in contact with the main body 1, and a bias is applied to the substrate 2.

FIGS. 14A and 14B are perspective views when the bias voltage application means 16 is installed in the vertical direction with respect to the main body 1 of the substrate holder. FIG. 14A shows the state in which the electrode of the bias voltage application means 16 has gone down and gotten out of contact with the main body 1, so no bias voltage is applied to the substrate 2. FIG. 14B shows the state in which the electrode of the bias voltage application means 16 controlled by the control means 100 has gone up and come in contact with the main body 1, so the bias is applied to the substrate 2.

Figure 17:
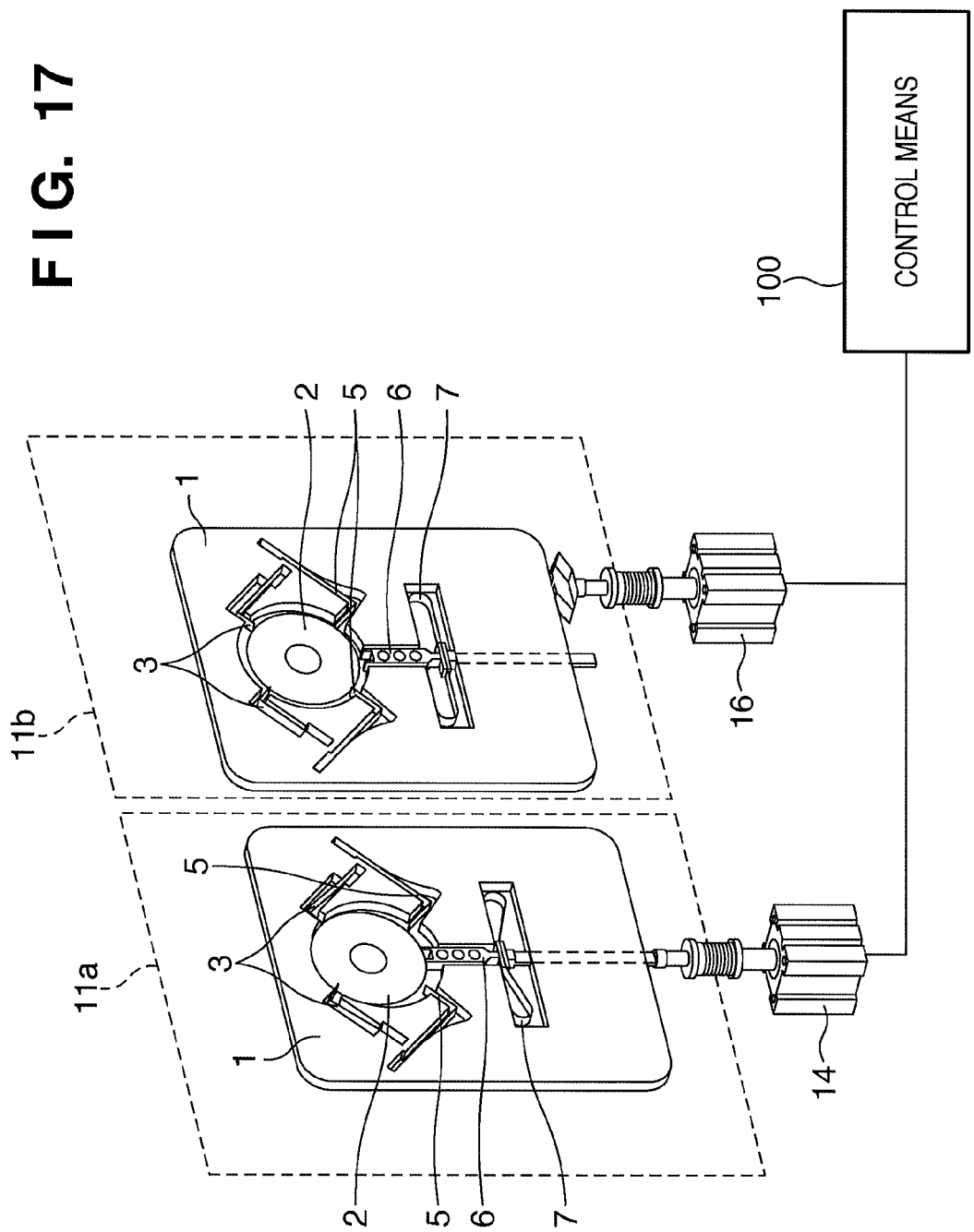
FIG. 17 is a perspective view of the configuration example shown in FIG. 3, in which the driving means 14 and bias voltage application means 16 are set in the vertical direction with respect to the main body 1 of the substrate holder.

FIG. 17 is a perspective view of the configuration example shown in FIG. 3, in which the driving means 14 and bias voltage application means 16 are installed in the vertical direction with respect to the main body 1 of the substrate holder. In the deposition chamber 11*a*, when the control means 100 moves up the driving means 14 and the auxiliary substrate supporting pawl 6 comes in contact with and moves up the substrate 2, the substrate supporting pawls 5 get out of contact with the substrate 2. In this state, the substrate 2 is supported by the substrate supporting pawls 3 and auxiliary substrate supporting pawl 6. In the deposition chamber 11*b*, the control means 100 moves up the bias voltage application means 16 and brings it into contact with the main body 1 of the substrate holder, the bias is applied to the substrate 2. Note that since there is no driving means 14 in FIG. 17B, the auxiliary substrate supporting pawl 6 goes down and separates from the substrate 2, that is, the auxiliary substrate supporting pawl 6 gets out of contact with the substrate 2, so the substrate 2 is supported by the substrate supporting pawls 3 and substrate supporting pawls 5.

Figure 8:
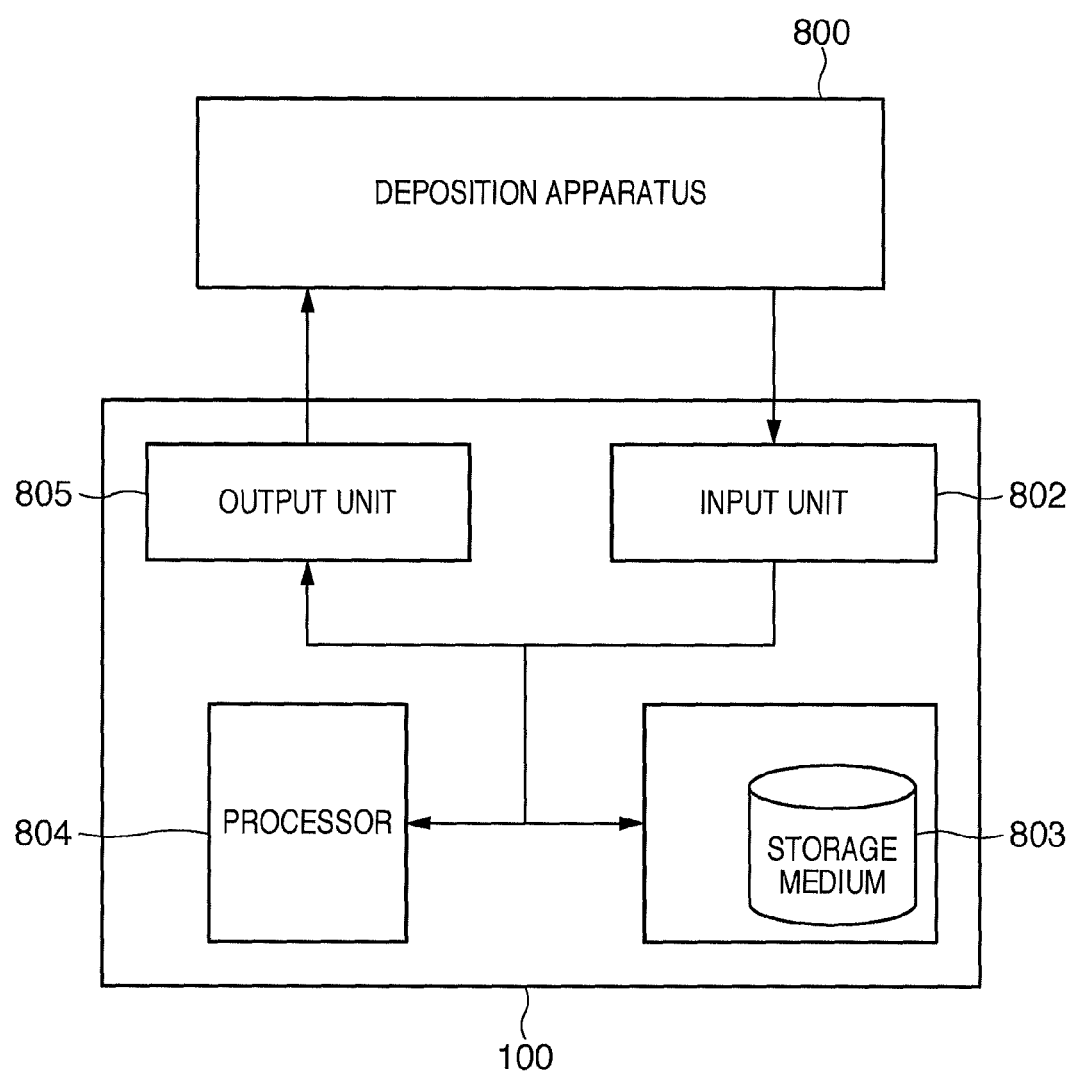
FIG. 8 is a block diagram showing the functional configuration of a control means 100.

FIG. 8 is a block diagram showing the functional configuration of the control means 100. Referring to FIG. 8, a deposition apparatus 800 (including the first deposition chamber 11a and second deposition chamber 11b) is connected to the control means 100. The control means 100 receives input signals from the first deposition chamber 11a and second deposition chamber 11b. The control means 100 operates control programs that are programmed to control the driving means 14, the power supply 15, the bias voltage application means 16, and processes to be executed in the chambers forming the deposition apparatus 800, and outputs operation instructions to the deposition apparatus 800. The control means 100 has the configuration of a computer (information processor) shown in FIG. 8. The control means 100 has an input unit 802 for receiving input signals from the deposition apparatus 800, a computer-readable storage medium 803 containing programs and data, a processor 804, and an output unit 805 for outputting operation instructions including control signals to the deposition apparatus 800. The input unit 802 has a function of receiving input data from the deposition apparatus 800, and can also receive, for example, input commands from an external apparatus connected across a network.

That is, when the substrate holder is in the first deposition chamber (11a in FIG. 3), the control means 100 moves the driving means 14 to bring the auxiliary substrate supporting pawl 6 (second support member) into contact with the insulating substrate 2, and bring the bias voltage application support members (substrate supporting pawls 5) out of contact with the insulating substrate 2. The control means 100 performs control to deposit an underlayer as a conductive film on the substrate by sputtering while supporting the substrate 2 by the substrate supporting pawls 3 (first support members) and auxiliary substrate supporting pawl 6 (second support member) except for the bias voltage application support members (substrate supporting pawls 5).

Also, when the substrate holder is in the second deposition chamber (11b in FIG. 3), the auxiliary substrate supporting pawl 6 (second support member) moves in order to get out of contact with the substrate 2, and gets out of contact with the substrate 2, because there is no driving means 14 for vertically moving the auxiliary substrate supporting pawl 6 (second support member) in the second deposition chamber (11b in FIG. 3).

The control means 100 moves the electrode of the bias application means 16 to bring the electrode into contact with the main body 1 of the substrate holder, holds the insulating substrate having the conductive film by the substrate supporting pawls 3 (first support members), and deposits a thin film on the insulating substrate having the conductive film while applying the bias from the bias voltage application support members (substrate supporting pawls 5) to the substrate.

FIG. 9 is a perspective view showing a modification of FIG. 3. Note that in FIG. 3, the bias voltage application means 16 is installed below the main body 1, and the contact point of the bias voltage application means 16 vertically moves. However, the spirit and scope of the present invention are not limited to the arrangement shown in FIG. 3. For example, as shown in FIG. 9, it is also possible to set the bias voltage application means 16 parallel to the main body 1, and apply the bias voltage to the main body 1 by horizontally moving the electrode.

Figure 10A:
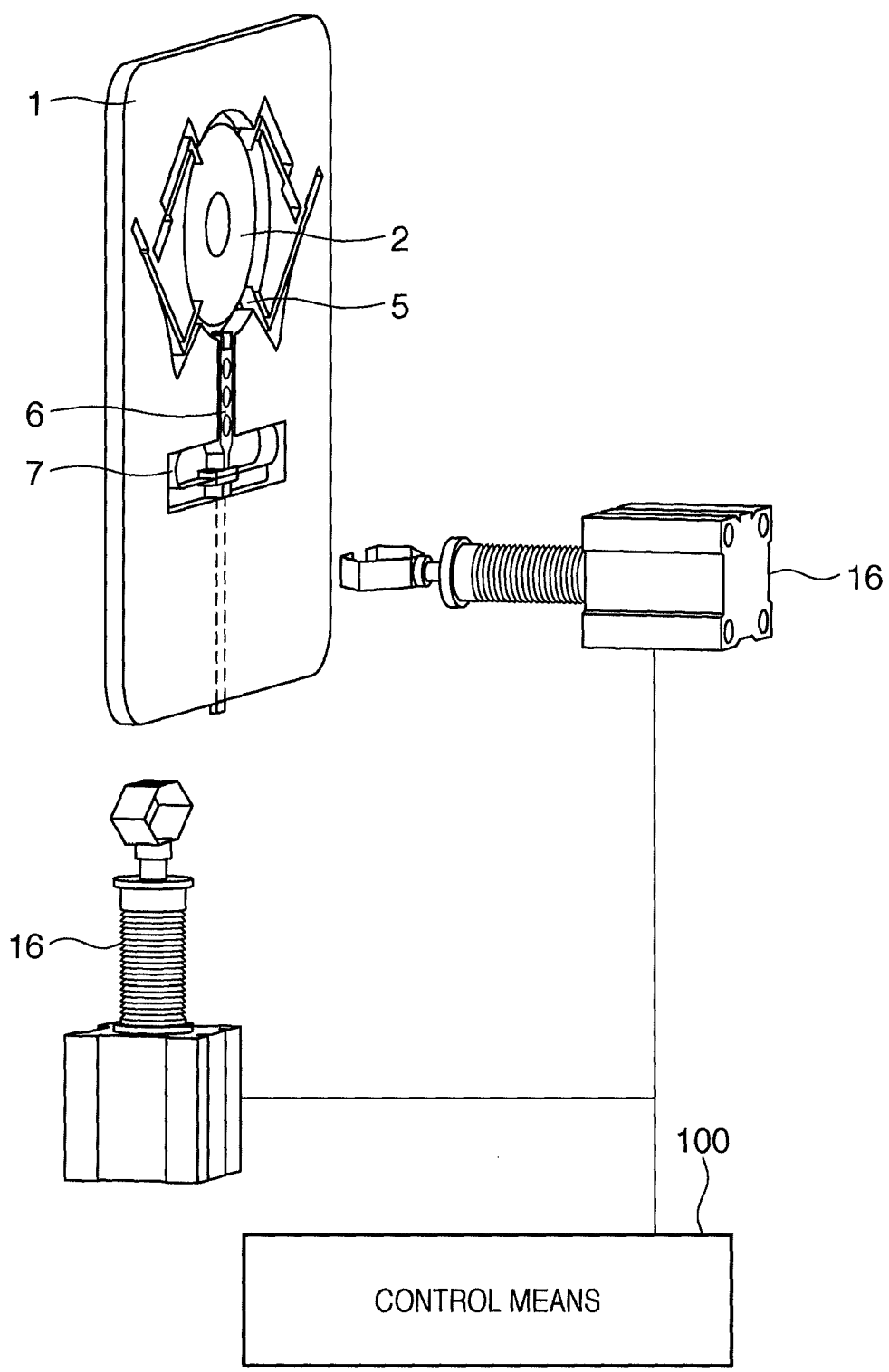
FIG. 10A is a view showing configuration examples of a bias voltage application means 16 installed such that an electrode is vertically movable, and a bias voltage application means 16 installed such that an electrode is horizontally movable (a non-contact state)
Figure 10B:
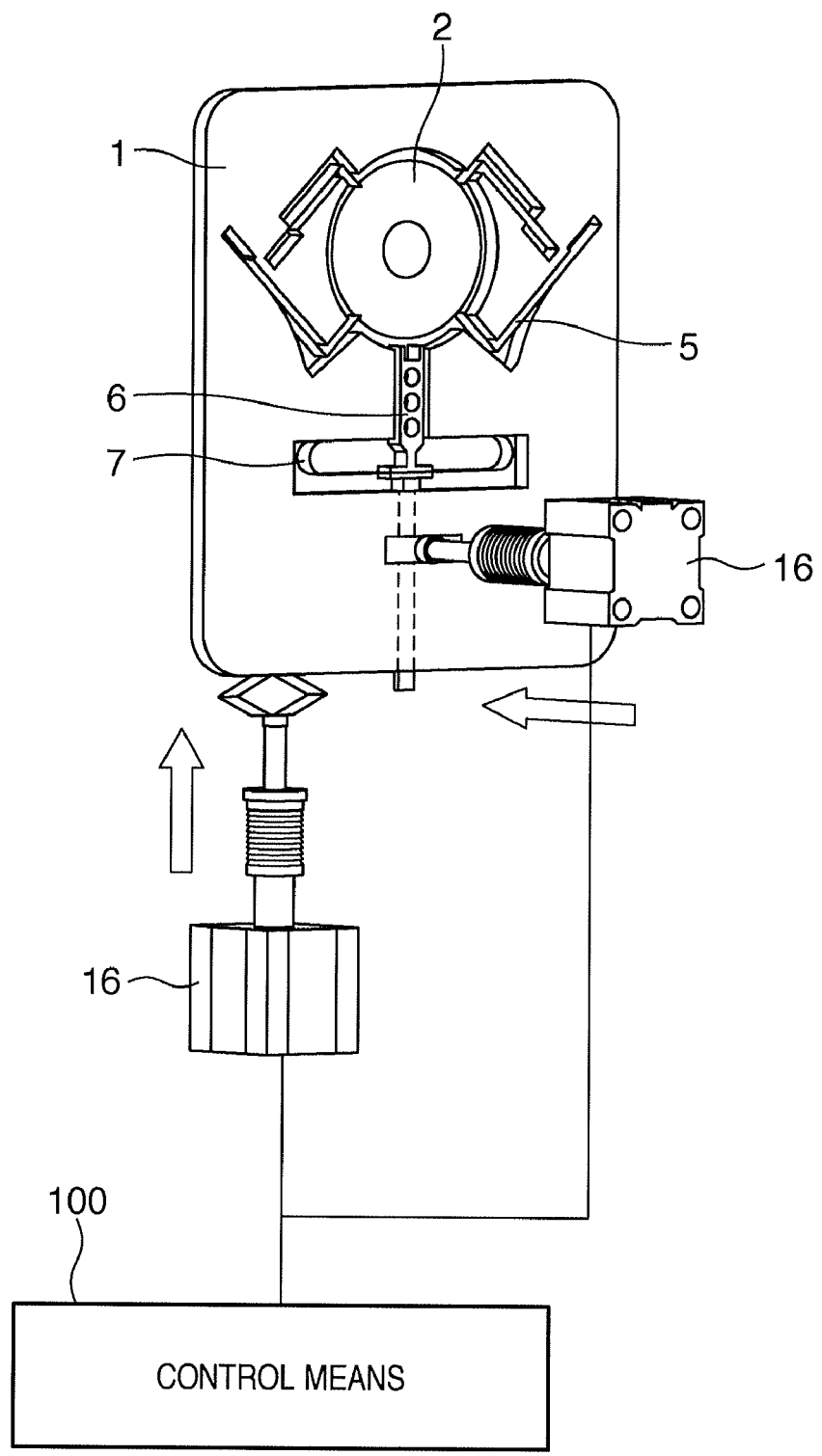
FIG. 10B is a view showing the configuration examples of the bias voltage application means 16 installed such that the electrode is vertically movable, and the bias voltage application means 16 installed such that the electrode is horizontally movable (a contact state)

FIG. 10A is a view showing configuration examples of the bias voltage application means 16 installed such that the electrode is vertically movable, and the bias voltage application means 16 installed such that the electrode is horizontally movable. FIG. 10A shows the state in which the electrode of each bias voltage application means 16 is out of contact with the main body 1 of the substrate holder. FIG. 10B shows the state in which the control means 100 performs control to bring the electrode of each bias voltage application means 16 into contact with the main body 1 of the substrate holder.

Figure 15A:
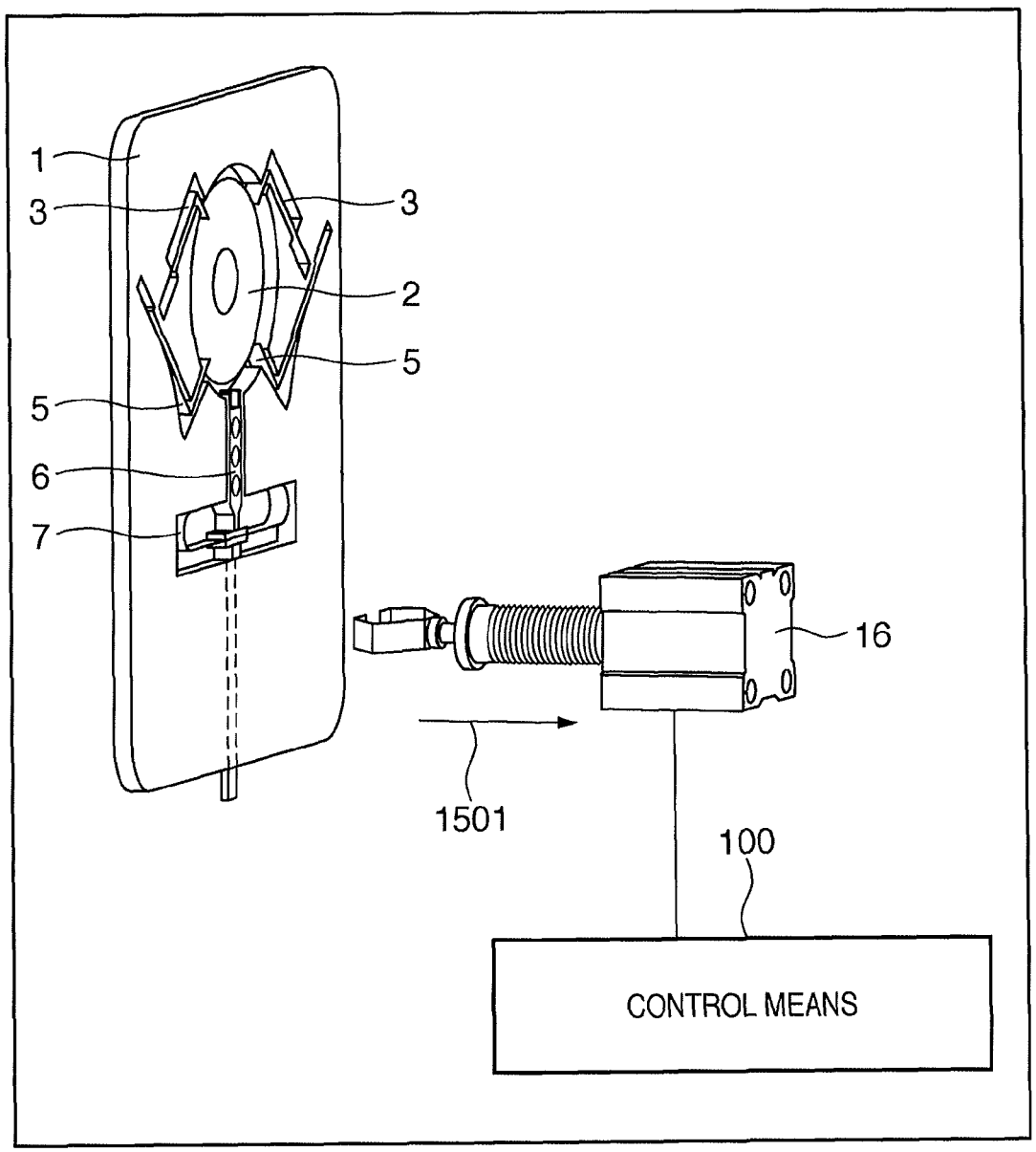
FIG. 15A is a perspective view when the bias voltage application means 16 is set in the horizontal direction with respect to the main body 1 of the substrate holder.
Figure 15B:
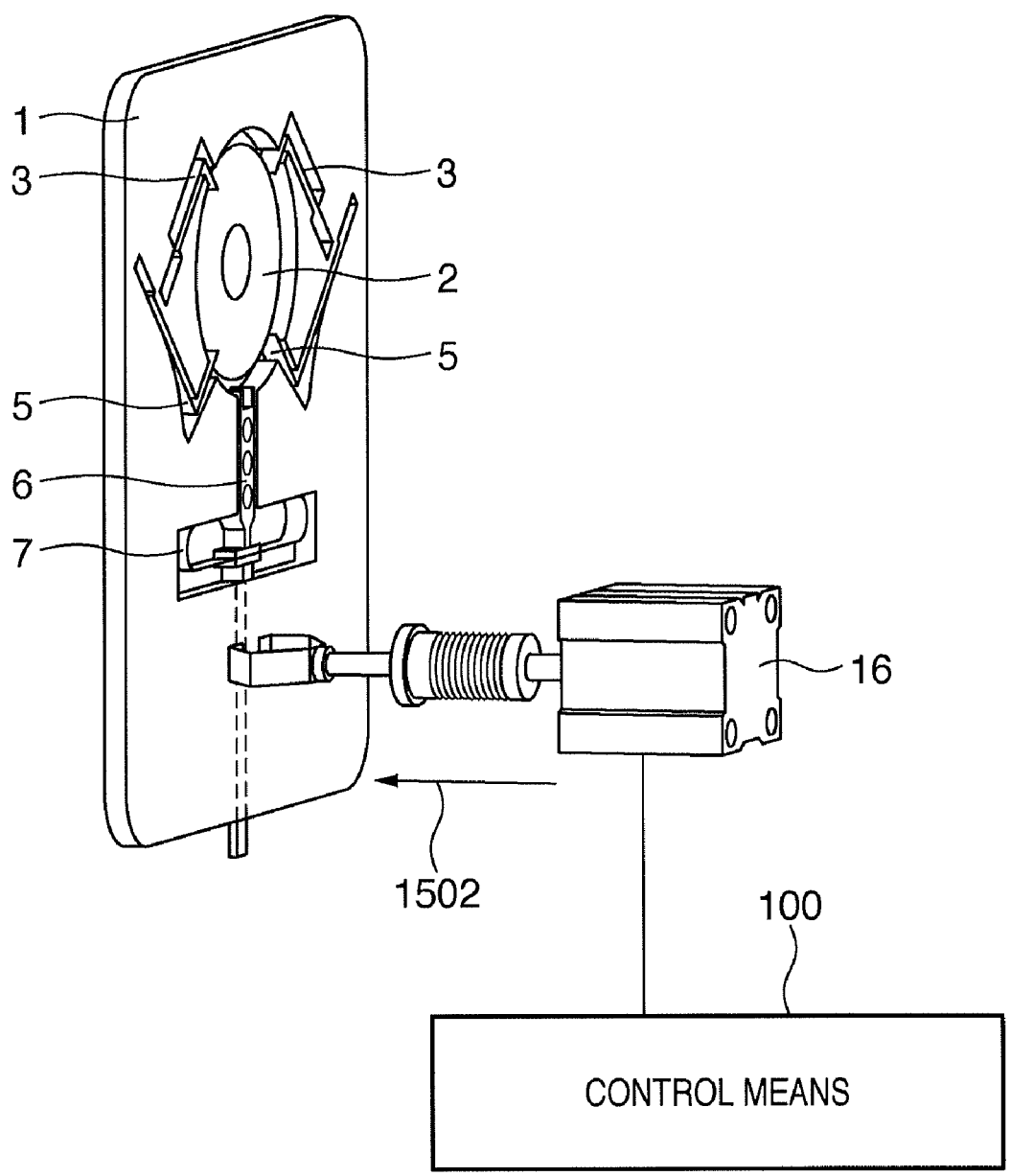
FIG. 15B is a perspective view when the bias voltage application means 16 is set in the horizontal direction with respect to the main body 1 of the substrate holder.

FIGS. 15A and 15B are perspective views when the bias voltage application means 16 is set in the horizontal direction with respect to the main body 1 of the substrate holder. When the control means 100 controls the bias voltage application means 16 set in the horizontal direction and the electrode moves to the right (in the direction of an arrow 1501) in the horizontal direction in FIG. 15A, the electrode of the bias voltage application means 16 gets out of contact with the main body 1 of the substrate holder, so no bias voltage is applied to the substrate 2 (FIG. 15A). Also, when the control means 100 controls the bias voltage application means 16 set in the horizontal direction and the electrode moves to the left (in the direction of an arrow 1502) in the horizontal direction in FIG. 15B, the electrode of the bias voltage application means 16 comes in contact with the main body 1 of the substrate holder, so the bias voltage is applied to the substrate 2 (FIG. 15B).

Figure 16:
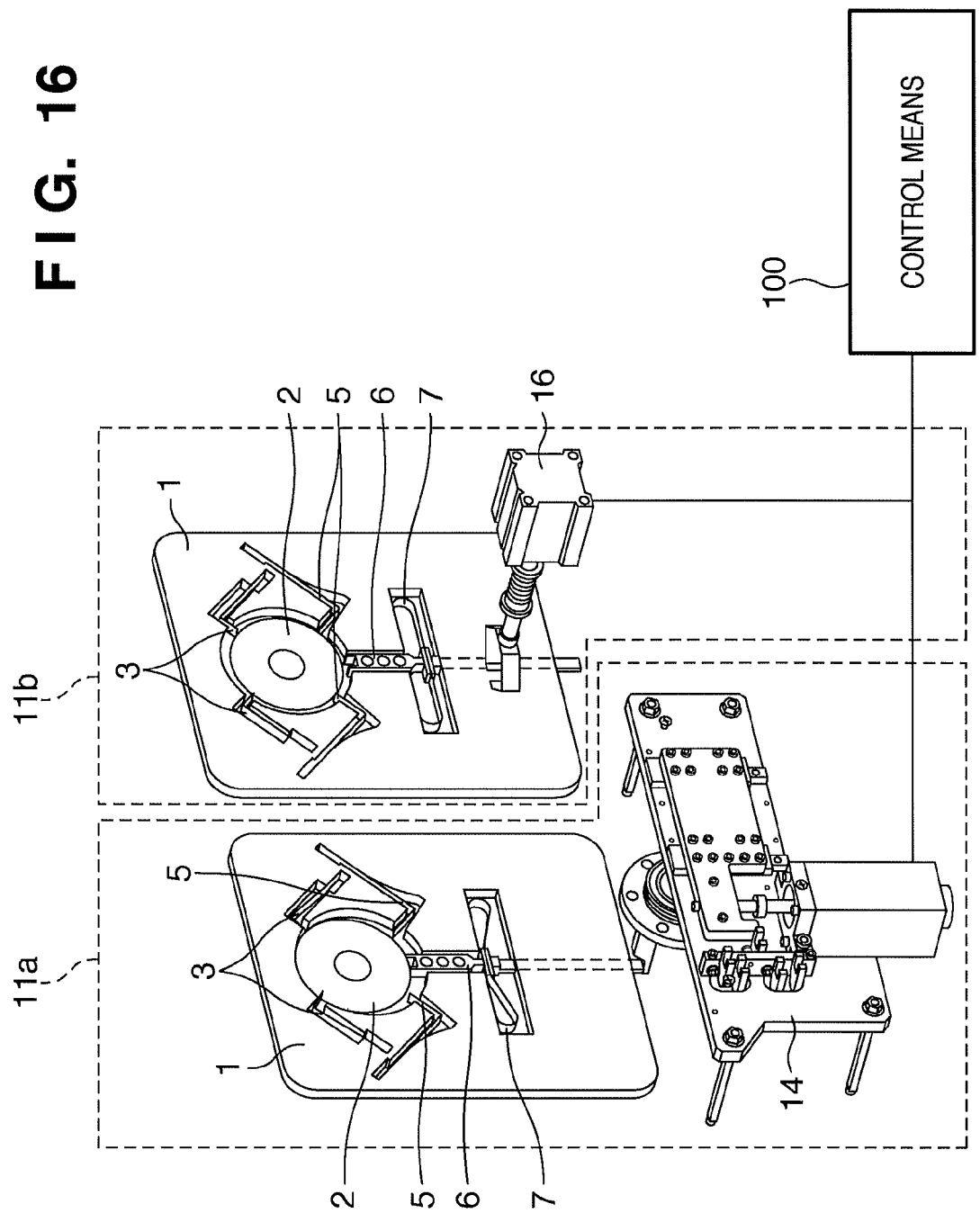
FIG. 16 is a view showing a configuration example in which the driving means 14 using a motor driving mechanism and the bias voltage application means 16 are set in the horizontal direction with respect to the main body 1 of the substrate holder.

FIG. 16 is a view showing a configuration example in which the driving means 14 using a motor driving mechanism and the bias voltage application means 16 are set in the horizontal direction with respect to the main body 1 of the substrate holder. When the control means 100 controls the driving amount of the motor, the driving means 14 goes up and comes in contact with the auxiliary substrate supporting pawl 6, and the auxiliary substrate supporting pawl 6 goes up and comes in contact with the substrate 2 in accordance with the upward motion of the driving means 14. In the deposition chamber 11a, the substrate 2 is supported by the substrate supporting pawls 3 and auxiliary substrate supporting pawl 6. In this state, the substrate supporting pawls 5 are out of contact with the substrate 2. When the control means 100 horizontally moves the electrode of the bias voltage application means 16, the electrode comes in contact with the main body 1 of the substrate holder, and the bias voltage is applied to the substrate 2. In the deposition chamber 11b, the auxiliary substrate supporting pawl 6 is out of contact with the substrate 2, and the substrate 2 is supported by the substrate supporting pawls 3 and substrate supporting pawls 5.

A deposition method of the present invention will be explained below by taking the case using the apparatus shown in FIG. 3 as an example.

The deposition method of the present invention is a method of continuously depositing a plurality of thin layers on the two principal surfaces of an insulating substrate. In the present invention, a first conductive layer made of a metal or the like is first deposited on the insulating substrate 2 by non-bias voltage application deposition in the deposition chamber 11a (a first deposition step). In the first deposition step, the driving means 14 pushes up the auxiliary substrate supporting pawl 6 to bring it into contact with the substrate 2 and separate the substrate supporting pawls 5 from the substrate 2 at the same time, thereby supporting the substrate 2 using the auxiliary substrate supporting pawl 6 and substrate supporting pawls 3. In this state, the substrate supporting pawls 5 functioning as bias voltage application support members are out of contact with the insulating substrate. Accordingly, the first conductive layer made of a metal or the like is also deposited in positions where the substrate supporting pawls 5 are in contact with the substrate 2 before they are brought out of contact with it.

When the deposition of the first layer is complete, the auxiliary substrate supporting pawl 6 is moved down by the restoring force of the leaf spring 7 by releasing the driving means 14 of the auxiliary substrate supporting pawl 6. Consequently, the auxiliary substrate supporting pawl 6 separates from the substrate 2, and the substrate supporting pawls 5 support the substrate 2 having gone down instead. In this state, the first layer is deposited in positions where the substrate supporting pawls 5 come in contact with the substrate 2, so the substrate supporting pawls 5 come in contact with the first layer.

The substrate 2 having undergone the deposition of the first layer is transferred together with the substrate holder to the deposition chamber 11b, and the bias voltage is applied to the main body 1 by bringing the electrode of the bias voltage application means 16 into contact with the main body 1 of the substrate holder. Since the substrate 2 is supported by the substrate supporting pawls 3 and 5, the bias voltage is applied to the first layer via the main body 1 and at least one of the substrate supporting pawls 3 and 5. By performing deposition in this state, a new thin layer (second layer) is deposited on the first layer by bias voltage application deposition (a second deposition step).

In this step, the bias voltage is applied to all the substrate supporting pawls 3 and 5. Since, however, the substrate supporting pawls 3 have supported the substrate 2 when the first layer is deposited, the regions of contact with the first layer are very small, and the voltage application efficiency is low. By contrast, the substrate supporting pawls 5 are separated from the substrate 2 when the first layer is deposited, so the first layer is deposited even in regions where the substrate supporting pawls 5 are in contact with the substrate 2. Since this expands the contact regions of the substrate supporting pawls 5 and first layer, efficient voltage application can be performed.

In the present invention, even when repeating the bias voltage application deposition step a plurality of number of times, the substrate supporting pawls 5 need not be separated from the substrate 2 whenever the step is performed. This makes it possible to minimize the generation of particles by the separation of the substrate supporting pawls 5 from the substrate 2.

Figure 4:
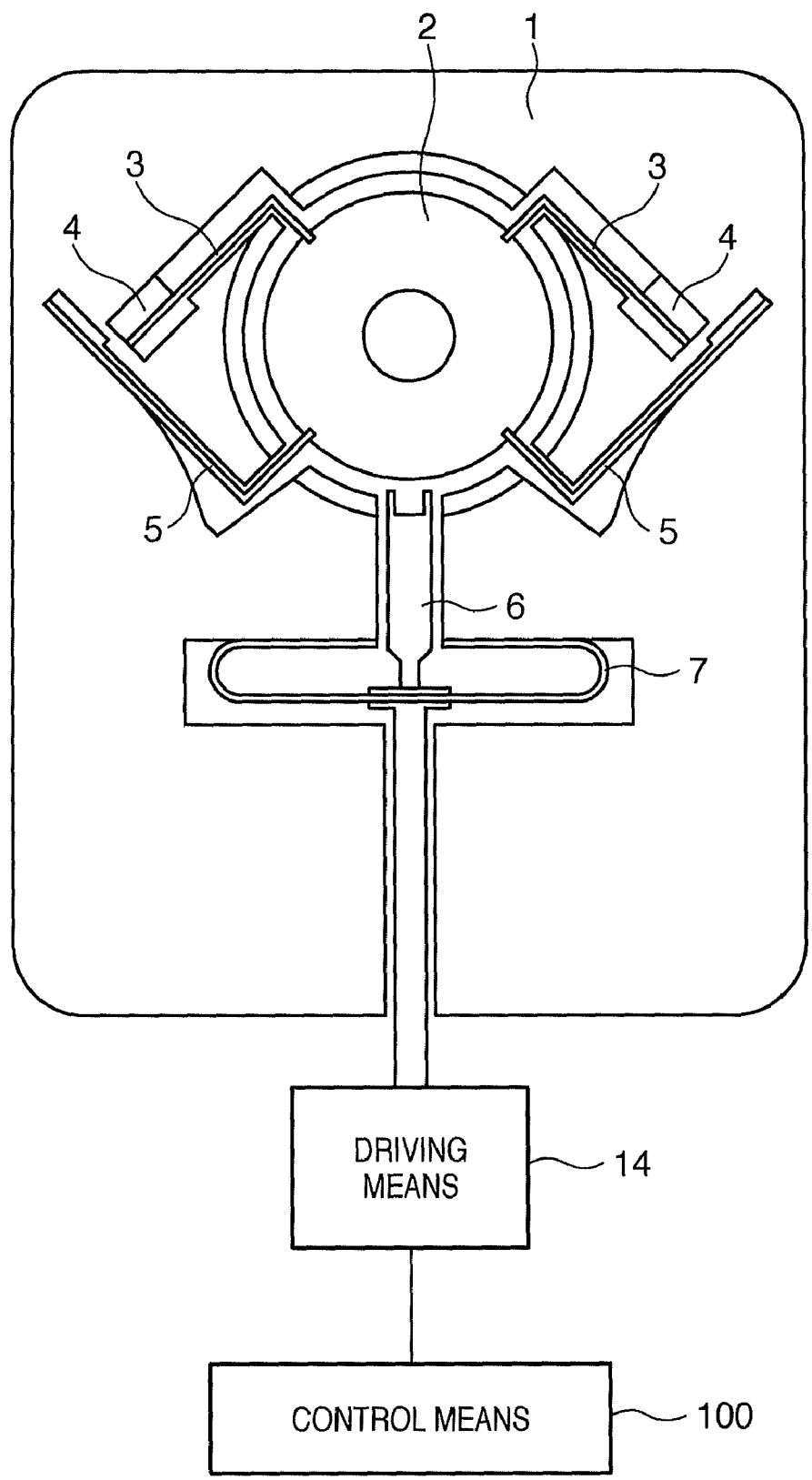
FIG. 4 is a view showing the state in which a substrate is held by an embodiment of a second substrate holder of the present invention, and used in bias voltage application deposition.
Figure 5:
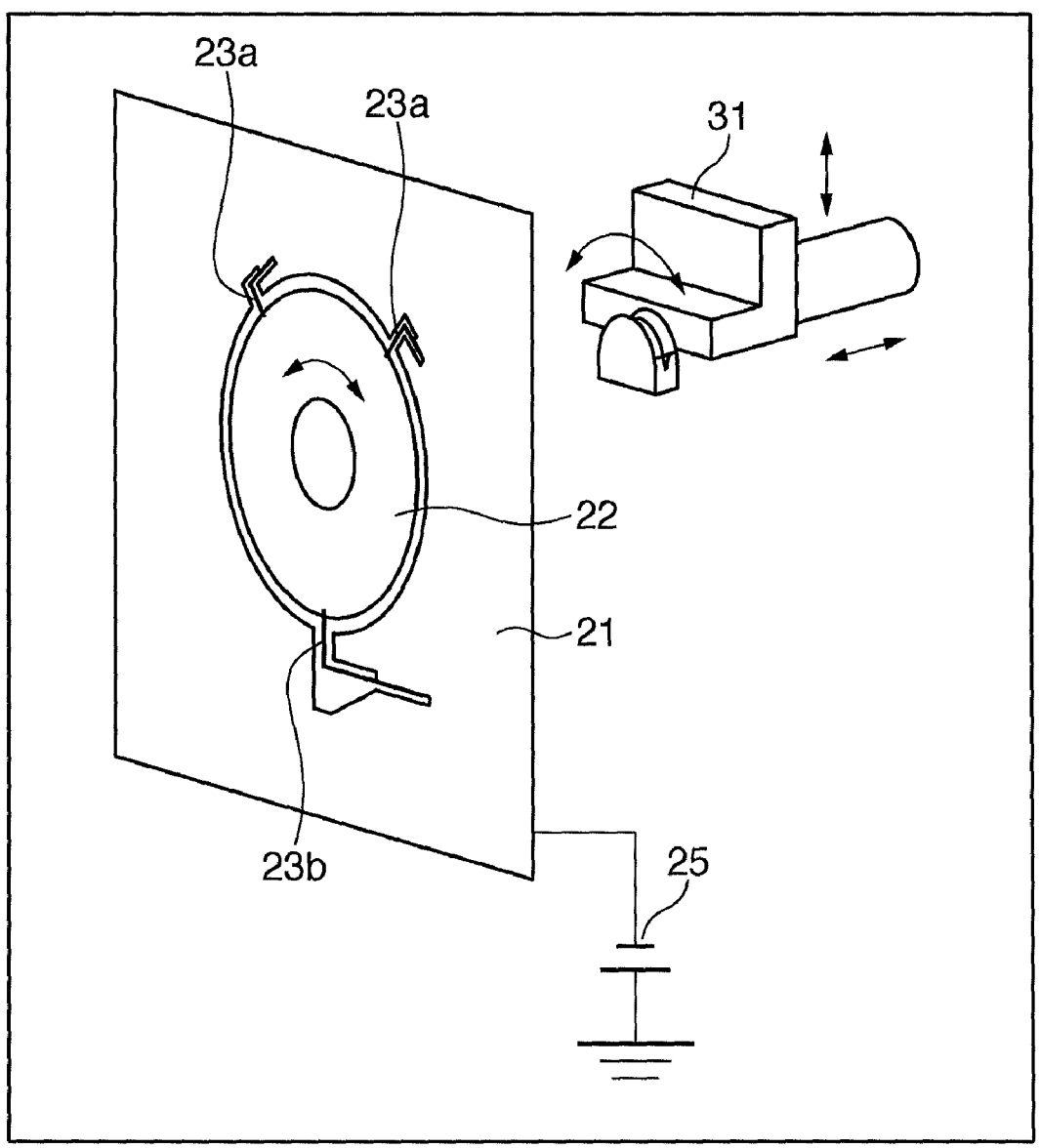
FIG. 5 is a perspective view exemplarily showing the arrangements of a substrate holder and substrate shift mechanism of a conventional deposition apparatus.
Figure 6A:
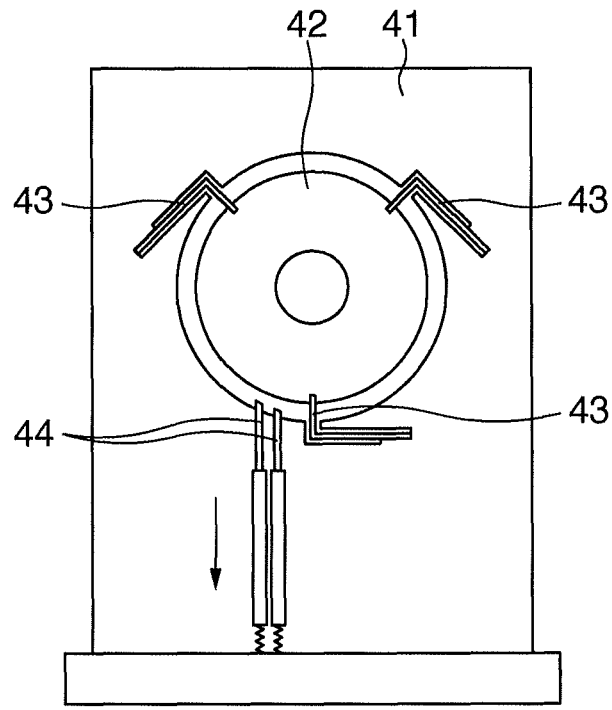
FIG. 6A is an exemplary view of a substrate holder of a conventional deposition apparatus.
Figure 6B:
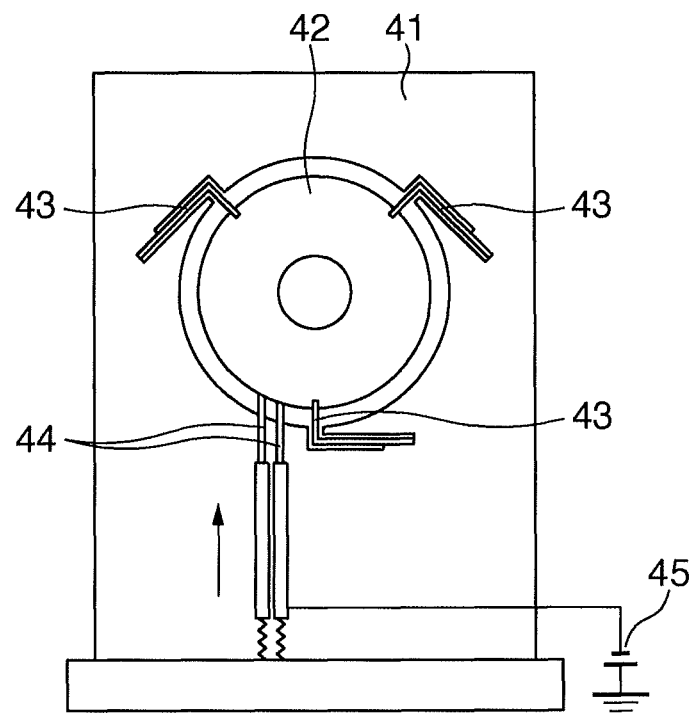
FIG. 6B is an exemplary view of the substrate holder of the conventional deposition apparatus.
Figure 7A:
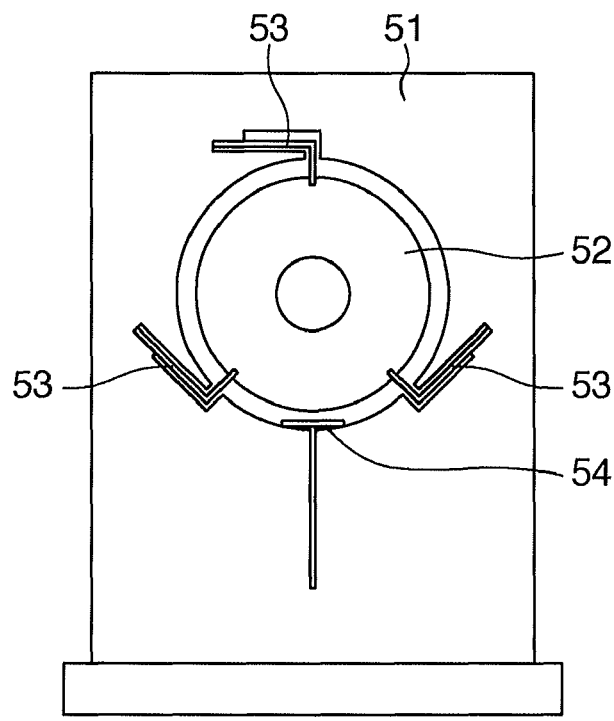
FIG. 7A is an exemplary view of a substrate holder of a conventional deposition apparatus.
Figure 7B:
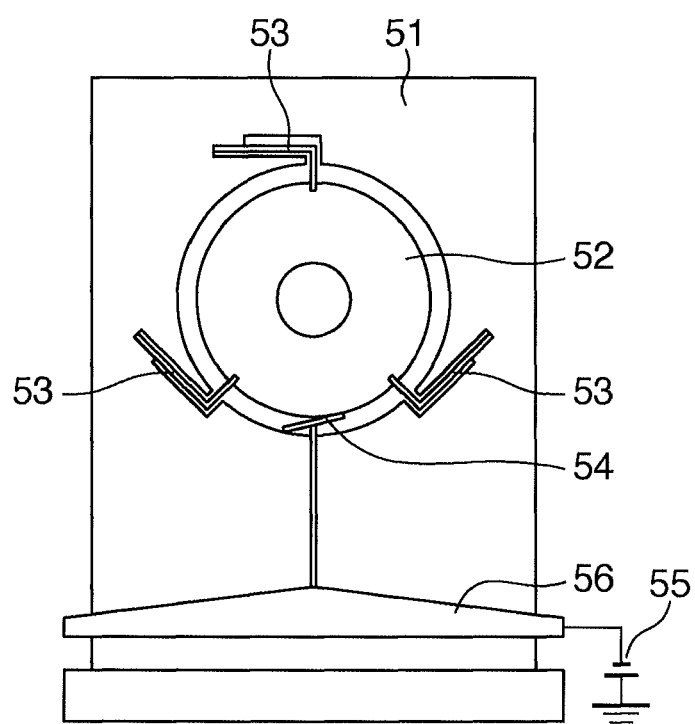
FIG. 7B is an exemplary view of the substrate holder of the conventional deposition apparatus.

Next, a second substrate holder of the present invention will be explained below with reference to FIG. 4. In FIG. 4, reference numerals 4 denote insulating members. In the second substrate holder, substrate supporting pawls 5 are bias voltage application substrate supporting pawls (bias voltage application support members), and substrate supporting pawls 3 except for these bias voltage application substrate support members are non-bias voltage application substrate supporting pawls (non-bias voltage application support members) to which no bias voltage is applied. That is, the substrate supporting pawls 5 are made of a conductive material and electrically connected to a main body 1, and the substrate supporting pawls 3 always in contact with a substrate 2 are given insulation properties or electrically insulated from the main body 1. Note that in FIG. 4, the conductive substrate supporting pawls 3 are attached to the main body 1 with the insulating members 4 interposed between them. However, the substrate supporting pawls 3 may also be made of an insulting material and directly attached to the main body 1.

In the second substrate holder, even when an external bias voltage application means applies a bias voltage to the main body 1, this bias voltage is not applied to the substrate supporting pawls 3. This makes it possible to reduce the generation of abnormal discharge in the substrate support portion during bias voltage application deposition.

The substrate supporting pawls 5 can be brought out of and into contact with the substrate 2 by bringing an auxiliary substrate supporting pawl 6 into and out of contact with the substrate 2 by vertically moving a driving means 14 under the control of a control means 100 in this embodiment as well. Accordingly, the substrate 2 takes the two states, that is, the state (a first state) in which the substrate 2 is supported by the substrate supporting pawls 3 and auxiliary substrate supporting pawl 6, and the state (a second state shown in FIG. 4) in which the substrate 2 is supported by the substrate supporting pawls 3 and 5. In other words, the substrate supporting pawls 3 for non-bias voltage application are always in contact with the substrate 2 and supporting it, and the substrate supporting pawls 5 for bias voltage application or the auxiliary substrate supporting pawl 6 additionally supports the substrate 2 in accordance with whether the bias voltage is applied or not applied. The first and second states are switched under the control of the control means 100.

Note that the number of the substrate supporting pawls in this embodiment is the same as that of the first substrate holder explained previously with reference to FIGS. 1 and 2. That is, at least one substrate supporting pawl for bias voltage application and at least one substrate supporting pawl for non-bias voltage application are necessary, but the total number of the substrate supporting pawls is preferably small as long as the substrate 2 can stably be held, because the number of shadow areas formed by the pawls is reduced. Although FIG. 4 shows the two bias voltage application substrate supporting pawls and two non-bias voltage application substrate supporting pawls, it is also possible to form one substrate supporting pawl 3 vertically above the substrate 2. Furthermore, it is possible to use only one of the substrate supporting pawls 5 as a bias voltage application substrate supporting pawl, and the other as a non-bias voltage application substrate supporting pawl by giving it the same arrangement as that of the substrate supporting pawls 3.

A deposition apparatus using the second substrate holder shown in FIG. 4 is basically the same as the deposition apparatus using the first substrate holder, and the apparatus shown in FIG. 3 is favorably used.

That is, the driving means 14 installed in the deposition chamber 11a shown in FIG. 3 pushes up the auxiliary substrate supporting pawl 6 of the second substrate holder to support the substrate 2 using the auxiliary substrate supporting pawl 6 and separate the substrate supporting pawls 5 from the substrate 2 at the same time. Also, in the deposition chamber 11b, the bias voltage of the bias voltage application means 16 is applied to the substrate supporting pawls 5 via the main body 1 by bringing the electrode of the bias voltage application means 16 into contact with the main body 1.

Furthermore, the only between a deposition method using the second substrate holder from the deposition method using the first substrate holder is that in bias voltage application deposition, no bias voltage is applied from the substrate supporting pawls 3 electrically insulated from the main body 1.

Note that in this embodiment, when the auxiliary substrate supporting pawl 6 is made of an insulating material or electrically insulated from the main body 1, all the substrate supporting pawls 3 and 6 supporting the substrate 2 can be electrically insulated from the main body 1 during non-bias voltage application deposition. Even when the bias voltage is applied to the main body 1, therefore, deposition can be performed without applying the bias voltage to the substrate 2. Accordingly, non-bias voltage application deposition can be performed even in an apparatus or deposition chamber in which the bias voltage is always applied to the main body 1.

The present invention is particularly favorably used in the manufacture of a hard disk. In the manufacture of a hard disk, at least an underlayer, magnetic layer, and protective layer are deposited on the two principal surfaces of an insulating substrate. In the present invention, it is possible to first deposit an underlayer by non-bias voltage application deposition described above, and then deposit a magnetic layer and protective layer by bias voltage application deposition.

The present invention has been explained by taking deposition by sputtering as an example, but may also be applied to a bias application step such as CVD or etching. Also, a conductive substrate can be processed by using the holder of the present invention.

Note that the substrate holder and the deposition method and deposition apparatus using the substrate holder according to the present invention are preferably used in processes other than the manufacture of a hard disk.

The preferred embodiments of the present invention have been explained above with reference to the accompanying drawings. However, the present invention is not limited to these embodiments and can be changed into various forms within the technical scope grasped from the description of the scope of the appended claims.

This application claims the benefit of Japanese Patent Application No. 2007-333836, filed Dec. 26, 2007, which is hereby incorporated by reference herein in its entirety.

The invention claimed is:

1. A substrate holder for supporting an insulating substrate, comprising:
   a conductive substrate holder main body having an opening;
   a plurality of first support members formed to protrude inside the opening from an inner periphery of the opening, and including a clamping member which supports one end portion of the insulating substrate; and
   a second support member including a clamping member which supports the other end portion of the insulating substrate, and configured to move to protrude inside the opening or retract from inside the opening,
   wherein at least one of said first support members is a bias voltage application support member configured to apply a bias voltage to the insulating substrate,
   when supporting the insulating substrate using the clamping member of said second support member, said second support member protrudes inside the opening such that the clamping member of said bias voltage application support member separates from the insulating substrate, and
   when supporting the insulating substrate using the clamping member of said bias voltage application support member, said second support member retracts from a position where the other end portion of the insulating substrate is supported by the clamping member of said second support member to a position where the insulating substrate is supported by the clamping member of said bias voltage application support member.

2. The substrate holder according to claim 1, wherein said second support member is made of an insulating material, or electrically insulated from said substrate holder main body.

3. The substrate holder according to claim 1, wherein in the opening of said substrate holder main body, the insulating substrate is supported in a direction perpendicular to a normal direction of a surface of the insulating substrate by said first support member or by said first support member and said second support member.

4. The substrate holder according to claim 1, wherein said second support member includes an elastic member which is pressed in accordance with the protruding motion of said second support member, and restores in accordance with the retracting motion of said second support member.

5. A substrate holder including a first support member including a plurality of clamping members which support an insulating substrate, and a conductive main body, a bias voltage being applicable to said main body from external bias voltage application means, comprising,
   in addition to the first support member including plurality of clamping members, a second support member configured to move to come in or get out of contact with the insulating substrate,
   wherein at least one of the plurality of clamping members of the first support member is a conductive bias voltage application substrate supporting member electrically connected to said main body, and the plurality of clamping members of the first support member except for said bias voltage application substrate supporting member are non-bias voltage application substrate supporting members made of an insulating material or electrically insulated from said main body,
   when said second support member is in contact with the insulating substrate, said bias voltage application substrate supporting member is out of contact with the insulating substrate, and the insulating substrate is held by said non-bias voltage application substrate supporting members and said second support member, and
   when said second support member is out of contact with the insulating substrate, all the plurality of clamping members of the first support member are in contact with the insulating substrate and hold the insulating substrate, and the external bias voltage application means applies the bias voltage to said bias voltage application substrate supporting member via said main body.

* * * * *